(12) United States Patent
Matsuo et al.

(10) Patent No.: US 6,734,568 B2
(45) Date of Patent: May 11, 2004

(54) SEMICONDUCTOR DEVICE AND METHOD OF MANUFACTURING THE SAME

(75) Inventors: Mie Matsuo, Kamakura (JP); Masahiro Miyata, Oita (JP); Hirokazu Ezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/228,081

(22) Filed: Aug. 27, 2002

(65) Prior Publication Data

US 2003/0052409 A1 Mar. 20, 2003

(30) Foreign Application Priority Data

Aug. 29, 2001 (JP) .................... P2001-259310
Sep. 27, 2001 (JP) .................... P2001-298252

(51) Int. Cl.$^7$ .................... H01L 23/48; H01L 23/52; H01L 29/40
(52) U.S. Cl. .................... 257/781; 257/780
(58) Field of Search .................... 257/781, 780, 257/737, 738; 438/614, 615

(56) References Cited

U.S. PATENT DOCUMENTS

| | | | |
|---|---|---|---|
| 5,656,542 A | 8/1997 | Miyata et al. ............... 438/645 |
| 5,656,858 A | 8/1997 | Kondo et al. ............... 257/737 |
| 5,736,456 A | 4/1998 | Akram .................... 438/614 |
| 5,821,627 A | 10/1998 | Mori et al. ............... 257/780 |
| 6,043,429 A | * 3/2000 | Blish, II et al. |
| 6,281,591 B1 | * 8/2001 | Nakamura |
| 6,323,546 B2 | * 11/2001 | Hsuan et al. |
| 6,388,322 B1 | * 5/2002 | Goossen et al. |
| 6,392,287 B1 | * 5/2002 | Kang |

OTHER PUBLICATIONS

Official Action dated Sep. 15, 2003 (with translation), issued by the Taiwanese Patent Office in counterpart application No. 091119676.

* cited by examiner

Primary Examiner—Sheila V. Clark
(74) Attorney, Agent, or Firm—Finnegan, Henderson, Farabow, Garrett & Dunner, L.L.P.

(57) ABSTRACT

A semiconductor device comprises an electrode formed above a substrate, an under bump metal (UBM) film on the electrode, the under bump metal film being in the shape of a recess, and a bump electrode embedded in the under bump metal film, the bump electrode having sides and bottom thereof surrounded by the under bump metal film.

22 Claims, 17 Drawing Sheets

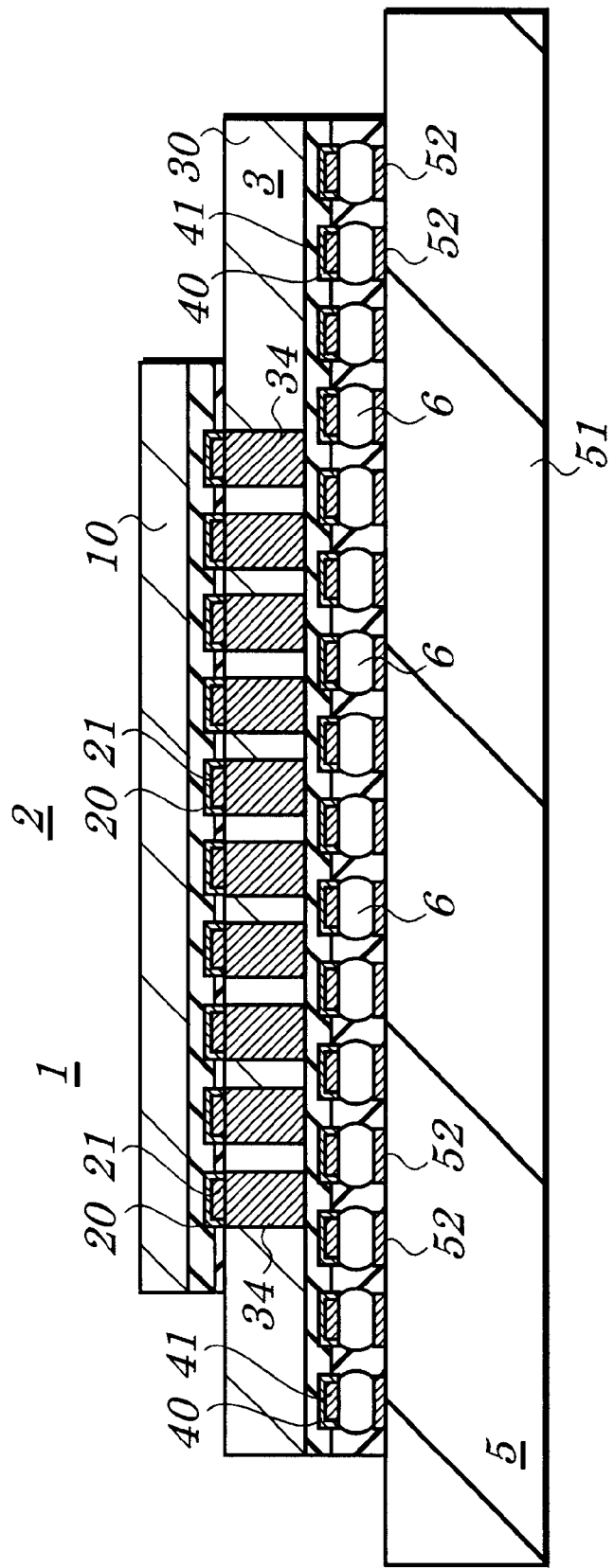

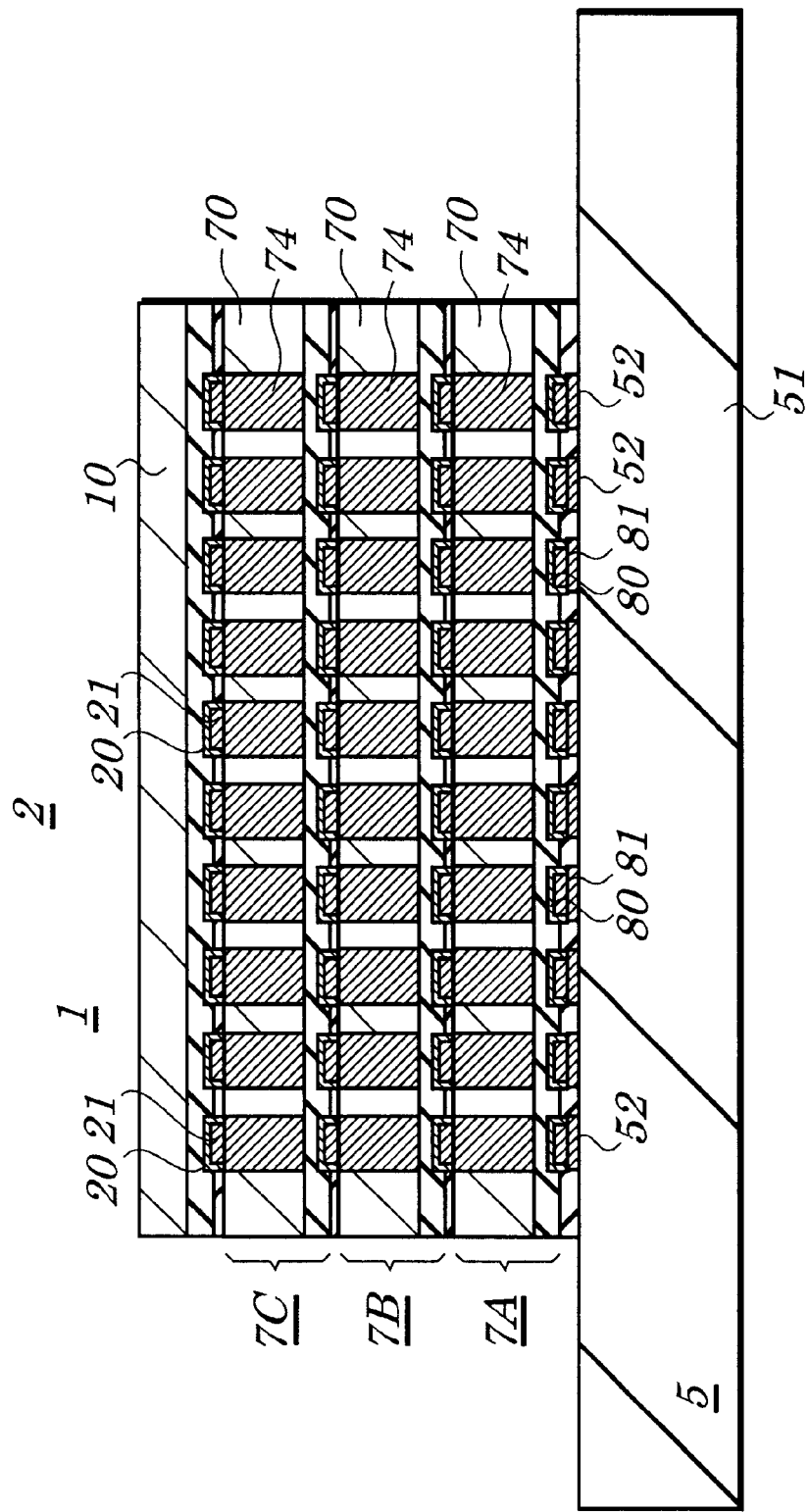

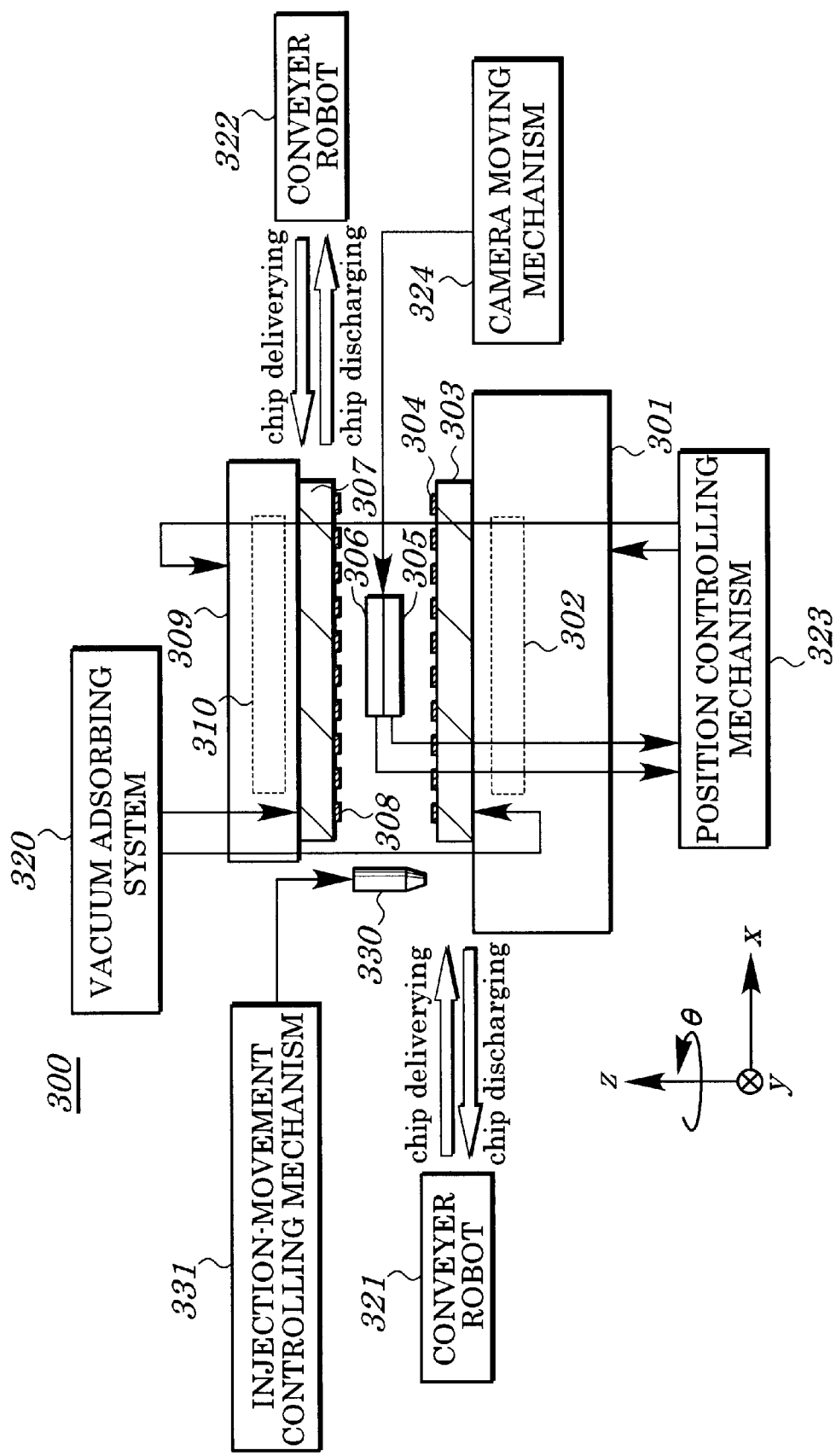

PRIOR ART

PRIOR ART

SEMICONDUCTOR DEVICE AND METHOD OF MANUFACTURING THE SAME

CROSS REFERENCE TO RELATED APPLICATIONS

This application is based upon and claims the benefit of the priorities from the prior Japanese Patent Applications No. 2001-259310 filed on or around Aug. 29, 2001 and No. 2001-298252 filed on or around Sep. 27, 2001, the entire contents of which are incorporated herein by reference.

BACKGROUND OF THE INVENTION

1. Field of the Invention

The invention relates to a semiconductor device and a method of manufacturing the same, and more particularly relates to a semiconductor device including a bump electrode provided on an electrode via an under bump metal film, and a method of manufacturing such a semiconductor device. Further, the invention relates to a semiconductor device in which substrates are joined, semiconductor substrates are joined, and the substrate and the semiconductor substrate are joined, and a method of manufacturing such a semiconductor device.

2. Description of the Related Art

As semiconductor chips constituting semiconductor devices are being highly integrated and improved in their functions, a variety of methods have been developed and applied in order to connect external connection electrodes (i.e. bonding pads) of the semiconductor chips to electrodes of a wiring substrate (i.e. a printed circuit board) on which the semiconductor chips are mounted. There have been strong demands for highly integrated semiconductor chips such as IC (integrated circuit) chips and LSI (large scale integrated circuit) chips to be compatible with high speed circuit operation, efficient heat diffusion, and accommodation of multiple terminals (pins). Recently, it is anticipated that high-end semiconductor chips are required to have several thousands of external connection electrodes (terminals).

Further, semiconductor devices have been required to be compact in size and light in weight, and to perform multiple functions in the view of a system side. In order to satisfy the foregoing requirements, it is inevitable to mount semiconductor chips in an extensively integrated state on the wiring substrate. A multiple chip structure or a three-dimensional mounting structure is being studied in order to meet requirements for multiple functions.

The flip chip (FC) method or tape-automated bonding method (TAB) using bump electrodes is advantageous in order to increase terminals. In the FC method, bump electrodes are provided at least at either external connection electrodes of the semiconductor chip or electrodes of the wiring substrate, and the bump electrodes and electrodes are connected, or the bump electrodes are mutually connected. For instance, in a semiconductor chip having an extremely large number of high-end terminals, a plurality of solder bump electrodes are arranged in the shape of a lattice on a surface (circuit mounding surface) of the semiconductor chip. The semiconductor chip is faced with a surface of the wiring substrate, and is mounted thereon. Thereafter, solder reflow is performed in order to join soldering bump electrodes and the wiring substrate, so that the semiconductor chip is mounted on the wiring substrate.

In the case of the TAB method, gold (Au) bump electrodes are provided on external connection terminals of the semiconductor chip, and copper (Cu)/tin (Sn) bump electrodes are formed on electrodes of the wiring substrate. Thereafter, the bump electrodes are positioned with respect to leads of the wiring substrate, and the Au bump electrodes are joined to the Sn/Cu bump electrodes by full thermo-compression. In this state, the semiconductor chips are completely mounted on the wiring substrate.

Minute bump electrodes are usually made by a plating process, as shown in FIG. 15(A) to FIG. 15(D) of the accompanying drawings.

(1) First of all, a semiconductor wafer 100 is prepared (see FIG. 15(A)). The semiconductor wafer 100 is in a state prior to the dicing into semiconductor chips. An external connection electrode (bonding pad) 101 is provided on the semiconductor wafer 100 at a position where a semiconductor chip is to be formed. A passivation film 102 is present on the external connection electrode 101, and has an aperture 102H. A polyimide group resin film 103 extends over a bump electrode forming region on the passivation film 102, and has an aperture 103H.

(2) An under bump metal (UBM) film 110 is formed all over the semiconductor wafer 100, i.e. on the polyimide group resin film 103, passivation film 102, an inner wall of the aperture 103H, an inner wall of the aperture 102H, and the external connection electrode 101 which is exposed from the apertures 103H and 102H. The UBM film 110 is applied by the sputtering, plating or the like, and is required to perform the following.

(a) To keep the external connection electrode 101 and Au bump electrode 112 (see FIG. 15(B)) electrically conductive;

(b) To keep the external connection electrode 101 and bump electrode 112 in close contact with each other;

(c) To function as a barrier for preventing heat diffusion between the external connection electrode 101 and the bump electrode 112, and preventing reduced conduction and adhesion depending upon time; and (d) To function as a feeding layer during the plating.

In order to meet these requirements, the UBM film 110 includes two or three stacked layers. For instance, the UBM film 110 is constituted by a titanium (Ti) layer, a nickel (Ni) layer and a palladium (Pd) layer which are stacked one over after another, or a chromium (Cr) layer, a Cu layer and an Au layer which are stacked one over after another, when observed from the external connection electrode 101 to the bump electrode. Further, the UBM film 110 is required to be several hundred nm to several $\mu$m thick.

(3) A photoresist film is applied onto the UBM film 110, and is exposed and developed by the photolithography process. A bump electrode-forming mask 111 is made using the photoresist film (refer to FIG. 15(B)). The mask 111 has an aperture 111H via which the UMB film 110 has its surface exposed on the external connection electrode 101.

(4) Electricity is supplied to the UBM film 110 by the electrolytic plating, so that the Au bump electrode 112 is formed on the UBM film 110 in the aperture 111H of the bump electrode-forming mask 111. Refer to FIG. 15(B).

(5) Thereafter, the bump electrode-forming mask 111 is stripped as shown in FIG. 15(C).

(6) The UBM film 110 is etched using the Au bump electrode 112 as an etching mask, and has its unnecessary part removed. For instance, when the UBM film 110 is constituted by the Ti, Ni and Pd layers, the Pd and Ni layers are wet-etched using a composite solution containing nitric acid, hydrochloric acid and acetic acid. Thereafter, the Ti layer is wet-etched using a fluoride acid solution.

A solder bump electrode made of lead (Pb)—Sn, silver (Ag)—Sn or the like are manufactured as shown in FIG. 16(A) to FIG. 16(E).

(1) First of all, a semiconductor wafer 100 is prepared as shown in FIG. 16(A), similarly to the foregoing Au bump electrode 112. An external connection electrode 101 is provided over a semiconductor chip forming regions of the semiconductor wafer 100. A passivation film 102 having an aperture 102H, and a polyimide group resin film 103 having an aperture 103H are formed over the external connection electrode 101.

(2) Referring to FIG. 16(A), a UBM film 110 is formed on the semiconductor wafer 100 and the external connection electrode 101. This UBM film 110 has the stacked structure similarly to the Au bump electrode 112. However, the UBM film 110 is thicker the UBM film 110 in the foregoing case in order to prevent diffusion of Sn from a solder bump electrode 122 to the external connection electrode 101.

(3) Thereafter, a bump electrode-forming mask 121 is formed on the UBM film 110 using the photolithography process (refer to FIG. 16(B)). The bump electrode-forming mask 121 has an aperture 121H via which the front surface of the UBM film 110 is exposed on the external connection electrode 101.

(4) Electricity is supplied to the UBM film 110 by the electrolytic plating process. Referring to FIG. 16(B), the solder bump electrode 122 is formed in an aperture 121H of the bump electrode-forming mask 121 and on the UBM film 110.

(5) The bump electrode-forming mask 121 is stripped as shown in FIG. 16(C).

(6) Referring to FIG. 16(D), the UBM film 110 is wet-etched using the solder bump electrode 122 as an etching mask, and has its unnecessary part removed.

(7) Solder reflowing is performed in order to form a spherical solder bump electrode 122B, as shown in FIG. 16(E).

The semiconductor devices including the Au bump electrode 112 and the solder bump electrode 122 seem to have the following problems.

(1) When making the Au bump electrode 112, the UBM film 110 is wet-etched in order to remove its unnecessary part. Since the wet-etching process is generally isotropic, undercuts 110U are caused just under the Au bump electrode 112, as shown by dotted lines in FIG. 17. For instance, when the semiconductor wafer 100 has an 8-inch diameter, each undercut 110U may be approximately 10 μm wide. It is assumed here that the Au bump electrode 112 has a diameter which is equal to or less than 20 μm. In such a case, the UBM film 110 is lessened by the undercuts 110U, so that no junction can be formed between the external connection electrode 101 and the Au bump electrode 112. This problem also occurs when manufacturing the solder bump electrode 122.

(2) It is very difficult to make a minute Au bump electrode 112 or solder bump electrode 122. Therefore, it is also very difficult for a semiconductor device to accelerate circuit operation, promote heat diffusion, increase the number of terminals, be compact in size and light in weight, and perform multiple functions.

(3) Either the Au bump electrode 112 or the solder bump electrode 122 may be joined with reduced mechanical strength because of the undercuts 110U of the UBM film 110. As a result, the joined portion may be cracked and broken due to stress resulting from a temperature cycle, which will lead to reduced reliability of the semiconductor device.

(4) It is conceivable to adopt a dry etching process or the anisotropic etching such as the reactive ion etching (RIE) process in order to remove the unnecessary part of the UBM film 110. However, the UBM film 110 includes materials which are difficult to dry-etch. If the dry etching process is forcibly applied, the UBM fill 110 has to be etched for a long period of time and at an increased cost.

On the other hand, it is very difficult to join electrodes, which are spaced with a reduced pitch therebetween, using the foregoing solder bump electrodes 122. Specifically, the solder bump electrodes 122 are melted once by the solder reflowing and then hardened in order to join the electrodes. It is difficult to control the shape of joined solder bump electrodes 122. Further, solder bump electrodes 122 tend to expand at sides where they are in contact with adjacent electrodes.

In order to overcome this problem, there is a recent trend to join electrodes in a semiconductor device without using solder bump electrodes. Referring to FIG. 18, an external connection electrode 201 of a semiconductor chip 200 is joined to an external connection electrode 211 of a semiconductor chip 210 without using a solder bump electrode. In other words, the external connection electrodes 201 and 211 are compressed and are joined. Prior to compression, the parallelism (an inclination from the x-y plane) of the semiconductor chips 200 and 210 is adjusted in order that the external connection electrodes 201 and 211 are aligned and have equal deviation of a rotation angle θ in the directions x and y and around the axis z.

Further, when the external connection electrodes 201 and 211 are made of metal such as Cu that easily generates compounds such as oxide or sulfide and so on, it is technically important to reliably join the external connection electrodes 201 and 211 without generating such compounds or to join them via their fresh surfaces after removing such compounds.

In a first method of overcoming the foregoing problem, electrodes may be joined in a hydrogen-reduced atmosphere. In this case, it is necessary to use a joining unit which can adjust the hydrogen-reduced atmosphere to a predetermined pressure and the parallelism of the semiconductor chips 200 and 210, align the external connection electrodes 201 and 211 in the unit of μm, control pressure to be applied, and promote heat for reduction reaction. Heating up to 450° C. is necessary for the reduction reaction.

The foregoing joining unit is very bulky and expensive, which means that semiconductor devices manufactured thereby will become also expensive.

There is a second method of overcoming the foregoing problem. In this method, the external connection electrodes 201 and 211 are irradiated by ions at the substantially room temperature and in extremely high vacuum in order to remove oxide or organic substances. Thereafter, the external connection electrodes 201 and 211 are joined. In the second method, it is also necessary to use a joining unit which can completely remove air from a space around the external connection electrodes 201 and 211, radiate ions onto them, adjust the parallelism of the semiconductor chips 200 and 210, align the external connection electrodes 201 and 211 in the unit of μm, control pressure to be applied. Heating up to 450° C. is necessary for the reduction reaction.

BRIEF SUMMARY OF THE INVENTION

According to a first aspect of the invention, there is provided a semiconductor device comprising: a first electrode formed above a first substrate; an under bump metal film on the first electrode, the under bump metal film being in the shape of a recess; and a bump electrode embedded in the under bump metal film, the bump electrode having sides and bottom thereof surrounded by the under bump metal film.

The invention provides, as a second aspect, a method of manufacturing a semiconductor device, comprising: forming an electrode; forming an insulating film on the electrode, the insulating film having an aperture; forming an under bump metal film on the insulating film, an inner wall of the aperture and the electrode in the aperture; forming a bump electrode film on the under bump metal film, and embedding the bump electrode film in the aperture; removing the bump electrode film and the under bump metal film from portions except for the aperture to form a bump electrode; and taking off at least a part of a surface of the insulating film.

According to a third aspect of the invention, there is provided a method of manufacturing a semiconductor device, comprising: forming a first substrate having a first electrode; forming a second substrate having a second electrode; applying a non-activated solvent onto a surface of at least one of the first and second electrodes; bringing the second electrode into contact with the first electrode via the non-activated solvent, and compressing the first and second electrodes; and activating the solvent at a temperature which is lower than a melting point temperatures of the first and second electrodes, before the first and second electrodes are joined.

In accordance with a fourth aspect of the invention, there is provided a method of manufacturing a semiconductor device, comprising: forming a first substrate having a first electrode; forming a second substrate having a second electrode; applying a non-activated solvent onto a surface of at least one of the first and second electrodes, the non-activated solvent being heat-cured and being activated at a temperature which is lower than a thermosetting temperature; bringing the second electrode into contact with the first electrode via the non-activated solvent, and compressing the first and second electrodes; activating the solvent at a temperature which is lower than a melting point temperatures of the first and second electrodes, before the first and second electrodes are joined; and heat-curing the solvent after the first and second electrodes are joined.

BRIEF DESCRIPTION OF THE SEVERAL VIEWS OF THE DRAWINGS

FIG. 3 is an enlarged schematic cross section of the semiconductor device having a first structure in the first embodiment.

FIG. 6 is a schematic cross section of the semiconductor device having a second structure in the first embodiment.

FIG. 10 shows a configuration of a semiconductor device manufacturing system in a fourth embodiment of the invention.

DETAILED DESCRIPTION OF THE INVENTION

Figure 1:
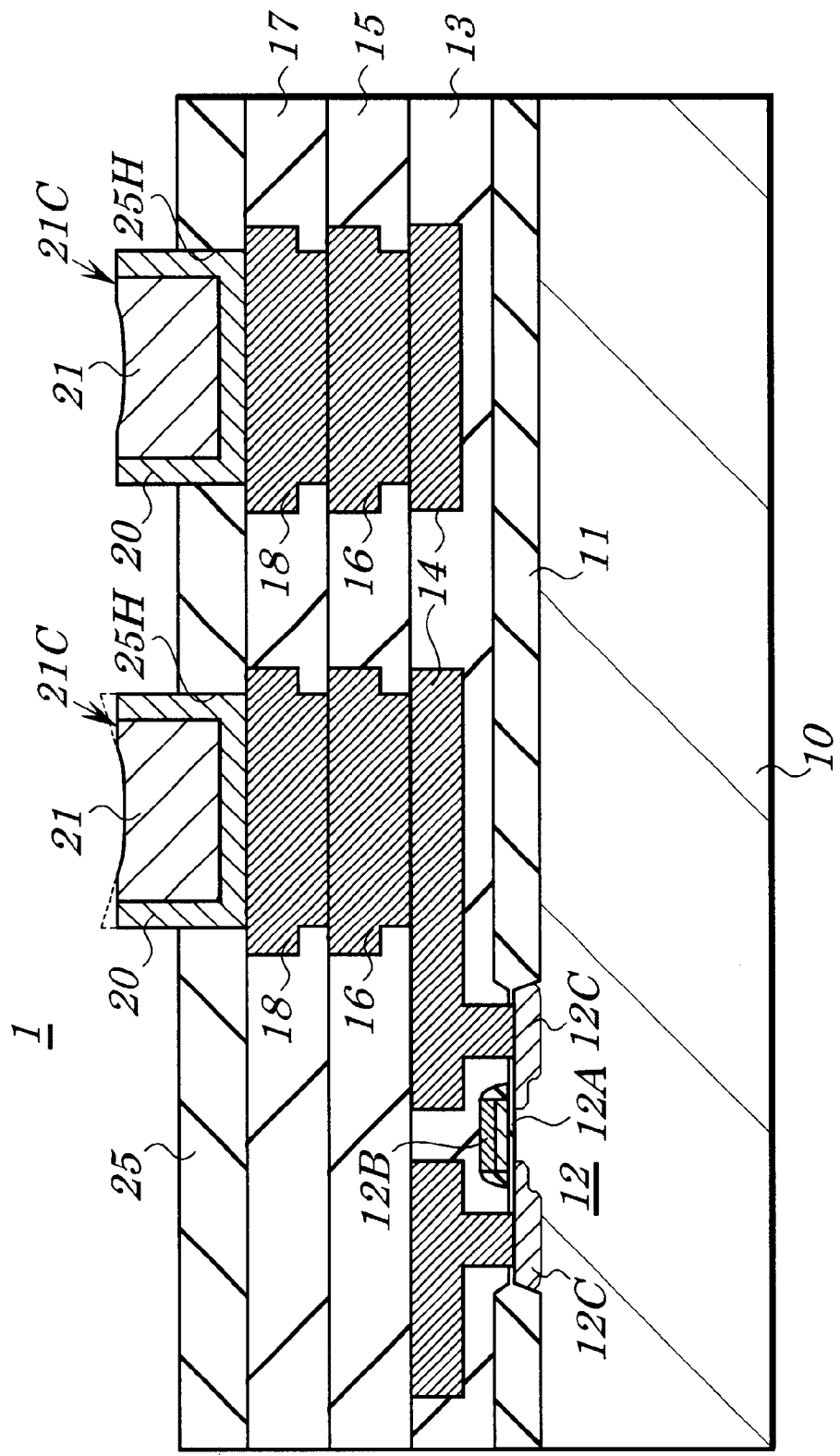
FIG. 1 is an enlarged cross section of a part of a semiconductor device in a first embodiment of the invention, showing the basic structure of a semiconductor chip and bump electrodes.

The following describe semiconductor devices and methods of manufacturing the semiconductor devices with reference to embodiments shown in the drawings. Like or corresponding parts are denoted by like or corresponding reference numbers. It should be noted that the drawings are schematic and that dimensional relationships between components shown therein sometimes differ from those of actual products.

First Embodiment of the Invention

[Basic Structures of Semiconductor Chip and Bump Electrode]

In a first embodiment, a semiconductor device has a basic structure as shown in FIG. 1, and comprises at least an external connection electrode 18, a UBM film 20 provided on the external connection electrode 18 and extending in the shape of a recess, and a bump electrode 21 having sides and bottom thereof surrounded by the UBM film 20.

Specifically, a semiconductor chip 1 comprises: a semiconductor substrate 10 constituted by a silicon single crystal substrate; an element 12 provided on a main surface (a circuit mounting surface) of the semiconductor substrate 10; a first wiring 14 on the element 12; a second wiring 16 on the first wiring 14; and the external connection electrode 18 also functioning as a third wiring on the second wiring 16. Each external connection electrode 18 serves as a external connection electrode for a semiconductor chip 1. In this embodiment, the semiconductor chip 1 has a three-layer wiring structure as described above. Alternatively, it may have any number of layers.

The element 12 is an insulated gate field effect transistor (IGFET) in this embodiment. IGFET includes at least a metal insulator semiconductor field effect transistor (MISFET), and a metal oxide semiconductor field effect transistor (MOSFET). Specifically, the element 12 includes a channel forming region constituted by the semiconductor substrate 10 (or a well region), an insulating gate film 12A on the channel forming region, a gate electrode 12B on the insulating gate film 12A, and a pair of semiconductor regions 12C positioned at opposite sides of the gate electrode 12B and functioning as a source or drain region. The element 12 is surrounded by an element isolating and insulating film 11. Alternatively, the element 12 may have a different element structure.

The first wiring 14 is provided on an inter-level isolation layer 13 extending over the element 12, and is electrically connected to the semiconductor region 12C via a connection hole (e.g. a through hole or a via hole) of the inter-level isolation layer 13. The first wiring 14, second wiring 16 (to be described later) and external connection electrode 18 are Cu wires or Cu alloy wires prepared by the damascene process. The first wiring 14 may be constituted by an aluminum (Al) film, an aluminum alloy film (e.g. an Al—Cu film, Al—Si film or Al—Cu—Si film), or the like. The inter-level isolation layers 13, 15 and 17 may be made of a single of layer of a silicon oxide film or a silicon nitride film, or a plurality of layers of foregoing films.

The second wiring 16 is placed on the inter-level isolation layer 17, and is electrically connected to the first wiring 14 via a connection hole of the inter-level isolation layer 17.

The external connection electrode (i.e. the third wiring) 18 is placed on the inter-level isolation layer 17, and is electrically connected to the second wiring 14 via a connection hole of the inter-level isolation layer 17.

The UBM film 20 has its bottom electrically and mechanically contacted with the surface of the external connection electrode 18. The UBM film 20 has sides which stand substantially upright on the external connection electrode 18, and are substantially as high as a bump electrode 21 received therein.

In this embodiment, the bump electrode 21 is a Cu bump electrode. The UBM film 20 is constituted by a tantalum nitride (TaN) film, a tantalum (Ta) film and a Cu film, all of which are stacked one over after another, when observed from the front surface of the external connection electrode 18. The uppermost Cu film is at least electrically conductive, and is efficiently in contact with the external connection electrode 18. The Ta film is at least electrically conductive, and functions as a barrier for preventing diffusion between the external connection electrode 18 and the bump electrode 21. The lowermost TaN film is at least electrically conductive, and functions as an anti-oxidant film. The UBM film 20 serves as a feeding layer when the bump electrode 21 is made by the electrolytic plating.

The bump electrode 21 is substantially surrounded by the UBM film 20, i.e. has its cross sectional shape defined by the UBM film 20. Although not shown, the outline of the bump electrode 21 may be circular, oval, rectangular, or polygonal such as hexagonal, octagonal and so on. It is preferable for the bump electrode 21 to have a circular or substantially circular outline in order to be mechanically resistant to a temperature cycle. Further, in the case of an application specific IC (ASIC) or the like, the bump electrode 21 is preferably polygonal in order to reduce an amount of electronic information if the outline of the bump electrode 21 is treated as electronic information. An open part defined by the UBM film 20 is generally identical to the outline of the bump electrode 21. Even when the electronic information on the outline of the bump electrode 21 (or a reticle pattern for forming a bump aperture 25H of an insulating film 25) has been set to a polygon, the outline of an actual bump electrode 21 becomes approximately circular due to adjacent effect in an exposure process, the wraparound of etching solution in the etching process or like while a semiconductor wafer is being produced. In this embodiment, the bump electrode 21 may be constituted by a Cu film prepared by the electrolytic plating process.

Generally speaking, the bump electrode 21 is substantially flat at its top, but has a chamfered peripheral edge 21C. As a result, the top of the bump electrode 21 is further flattened. A bump electrode film 21A and UMB film 20 (shown in FIG. 2(B)) at unnecessary parts of the bump electrode 21 can be removed by chemical mechanical polishing (CMP) as will be described later with respect to a semiconductor device manufacturing method. The bump electrode 21 is softer than the insulating film 25, so that the upper center of the bump electrode 21 becomes slightly concave, which may cause the peripheral edge of the bump electrode 21 to be sharpened as shown by dotted lines (see FIG. 1). Therefore, the sharpened edge of the bump electrode 21 is chamfered as described above, if necessary.

At least a part of the external connection electrode 18 in contact with the bump electrode 21, i.e. at least a part of the UBM film 20 in contact with the external connection electrode 18, is covered by the insulating film 25 serving as a passivation film. In short, a part of the bump electrode 21 in contact with the external connection electrode 18 is fitted in the bump aperture 25H of the insulating film 25 via the UBM film 20.

The insulating film 25 may be a non-organic insulating films such as a silicon oxide film, a silicon nitride film or the like which is prepared by the plasma CVD (chemical vapor deposition) process. Alternatively, the insulating film 25 may be an organic insulating film such as a silicon oxide film prepared by the spin-on-glass process (SOG), a polyimide group resin film prepared by the spin coating process, or the like.

In the semiconductor device of this embodiment, the UBM film 20 surrounds the sides and bottom of the bump electrode 21, and enables the formation of a sufficient sectional area for introducing electricity and diffusing heat between the external connection electrode 18 and the bump electrode 21. This is effective in promoting microfabrication of the bump electrode 21, and increasing the number of terminals. Further, The UBM film 20 protects the side surfaces of the bump electrode 21 against corrosion, which improves the reliability of the semiconductor device. The bump electrode 21 has its top adapted to be joined to another electrodes (such as an interposer plug 34 shown in FIG. 3 and FIG. 4), and is protected against corrosion. This is because the top of the bump electrode 21 is not exposed.

The UBM film 20 is mechanically strong to protect the bump electrode 21 against deformation and enables the bump electrode 21 to have uniform height. This is effective in promoting reliable connections between the bump electrode 21 and other electrodes thereon.

The insulating film 25 mechanically reinforces the connection between the external connection terminal 18 and the UBM film 20 and the connection between the UBM film 20 and the bump electrode 21. Therefore, it is possible to prevent the foregoing connections from being cracked or broken by shearing force caused by the thermal cycle, and to improve the electrical reliability of the connections. When it is a non-organic insulating film such as a silicon oxide film or a silicon nitride film, the insulating film 25 can reliably protect the foregoing connections against the shearing force. Alternatively, the insulating film 25 made of an organic insulating film such as a polyimide group resin film can absorb the shearing force.

The bump electrode 21 has the chamfered upper edge 21C, and becomes flattened at the top thereof, which is effective in improving the electrical reliability of the connections between the bump electrode 21 and other electrodes.

[Methods of Manufacturing Bump Electrode and Semiconductor Device]

The semiconductor device including the foregoing bump electrode 21 is manufactured by a method which is shown in FIG. 2(A) to FIG. 2(E). It is assumed here that the method is applied to produce a minute Cu bump electrode having a 5 $\mu$m diameter and 0.5 $\mu$m height.

Figure 2A:
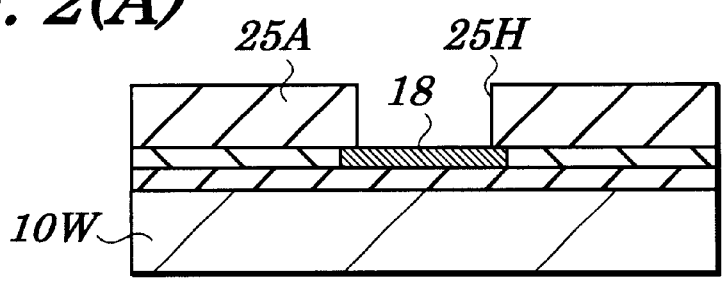
FIG. 2(A) to FIG. 2(E) are cross sections of the bump electrode, showing how the semiconductor device is manufactured in the first embodiment.

(1) First of all, referring to FIG. 2(A), a semiconductor wafer 10W is prepared, and is in the state prior to a dicing process to obtain a semiconductor chip. The semiconductor wafer 10W is a silicon single crystal wafer, and includes an external connection electrode 18 mounted on a circuit mounting surface where semiconductor chip is to be formed.

(2) As shown in FIG. 2(A), the insulating film 25A having the bump aperture 25H is formed on the external connection electrode 18. For instance, the insulating film 25A is a non-organic insulating film such as a silicon oxide film, a silicon nitride film or the like prepared by the plasma CVD process, and is 1.5 $\mu$m thick. In order to make the bump aperture 25H, a photo-resist film is formed on the insulating film 25A, and is exposed and developed by the photolithography process in order to obtain an etching mask. Then, the insulating film 25A is patterned by the anisotropic etching such as RIE and using the etching mask. The anisotrophic etching is preferable in view of scale down. Alternatively, the insulating film 25A may be an organic insulating film as described above.

Figure 2B:
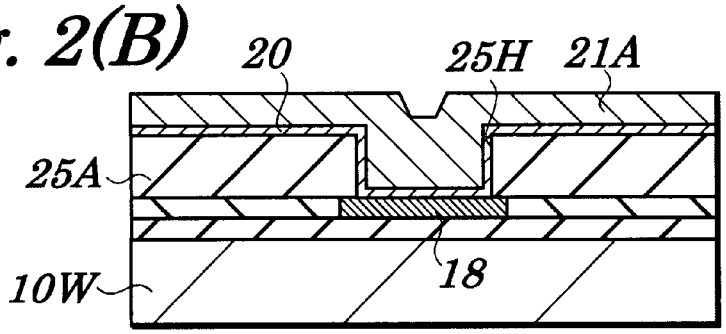

(3) The UBM film 20 is applied onto the semiconductor wafer 10W, i.e. onto the insulating film 25A, inner wall of the bump aperture 25H, and the external connection terminal 18 in the bump aperture 25H (refer to FIG. 2(B)). For example, the UBM film 20 is constituted by an approximately 80 nm–200 nm thick Cu film, an approximately 5 nm–50 nm thick Ta film, and an approximately 5 nm–50 nm thick TaN film. All of these films are prepared by a continuous spattering process. The UBM film 20 is substantially uniformly thick on the inner surface of the bump aperture 25H and on the external connection electrode 18.

(4) The bump electrode film 21A is applied onto the UBM film 20 in order to cover the bump aperture 25H, as shown in FIG. 2(B). The bump electrode film 21A is a Cu film prepared by the electrolytic plating process using the UBM film 20 as a feeding film. The Cu film is approximately 1.0 $\mu$m to 3.0 $\mu$m thick, for example.

Figure 2C:
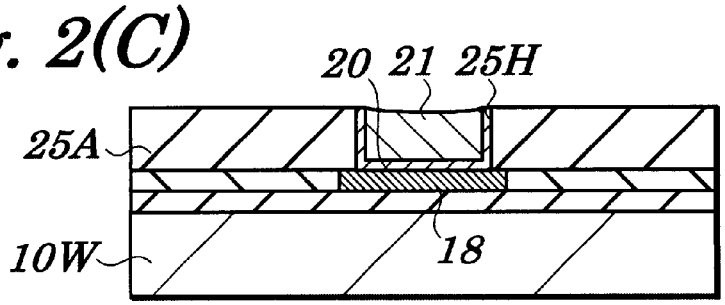

(5) Referring to FIG. 2(C), unnecessary parts of the bump electrode film 21A and UBM film 20 are removed by the CMP. The bump electrode 21 is defined by the side of the bump aperture 25H and the UBM film 20 on the external connection electrode 18 at the bottom of the bump aperture 25H. In the CMP process, the semiconductor wafer 10W is chemically and mechanically polished, so that it can be uniformly flattened. In other words, the insulating film 25A, the UBM film 20 in the bump aperture 25H and the bump electrode 21 are substantially flush with one another.

Figure 2D:
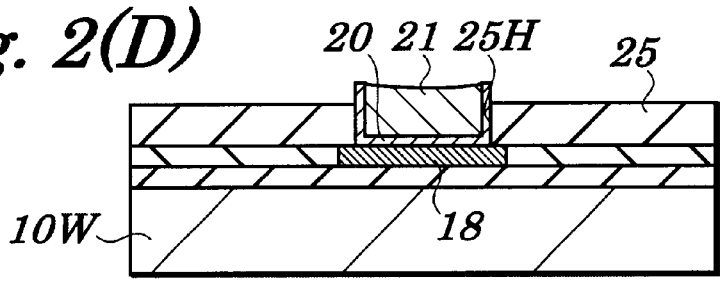

(6) The insulating film 25A has its surface partially removed by the dry or wet etching process, so that the UBM film 20 and the bump electrode 21 project therefrom. Refer to FIG. 2(D). Specifically, the insulating film 25A is removed by an amount of approximately 0.5 $\mu$m, and is finally 1.0 $\mu$m thick. Further, if it is an organic group resin film, the insulating film 25A may be partially removed using a plasma asher.

If the external connection terminal 18 and the UBM film 20 are in sufficiently close contact with each other, the insulating film 25A may be completely removed.

(7) The bump electrode 21 is slightly concave at its top center and has a sharpened edge, which is chamfered by the CMP process as shown by the reference numeral 21C, so that the upper surface of the bump electrode 21 is flattened.

(8) After the foregoing processes, the semiconductor wafer 10W is electrically and mechanically connected to the external connection terminal 18 via the UBM film 20 and includes the bump electrode 21 standing 0.5 $\mu$m from the insulating film 25A.

(9) Thereafter, the semiconductor wafer 10W is subject to the dicing process, so that the semiconductor chips 1 as shown in FIG. 1 will be produced.

(10) The semiconductor chip 1 will be mounted on a multiple layer wiring substrate 5 (shown in FIG. 3), and a semiconductor device 2 (shown in FIG. 3) will be completed.

In the first embodiment, the insulating film 25A with the bump aperture 25H is prepared first. The UBM film 20 is applied over the bump aperture 25H and the external connection electrode 18. The UBM film 20 is not patterned by the wet etching process using the bump electrode 21 as a mask, which prevents side etching of the UBM film 20. Therefore, the external connection electrode 18 and the bump electrode 21 can be reliably conductive therebetween via the UBM film 20, which improves manufacturing throughput of the semiconductor device. Further, the minute bump electrode 21 having a diameter of 5 $\mu$m, for instance, can be manufactured without difficulty.

The upper surface of the insulating film 25A is flattened by the CMP, which enables the bump electrode 21 to have uniform height and to be free from poor connections. Further, the unnecessary parts of the bump electrode film 21A and UBM film 20 on the insulating film 25A are removed by the CMP process one after another, which is effective in reducing the number of manufacturing steps.

Further, the sharpened upper edge of the bump electrode 21 is chamfered, which is effective in flattening the upper surface of the bump electrode 21, reducing poor connections between the bump electrode 21 and other electrodes arranged thereon, and improving manufacturing throughput of the semiconductor device.

[First Structure of Semiconductor Device]

Figure 4:
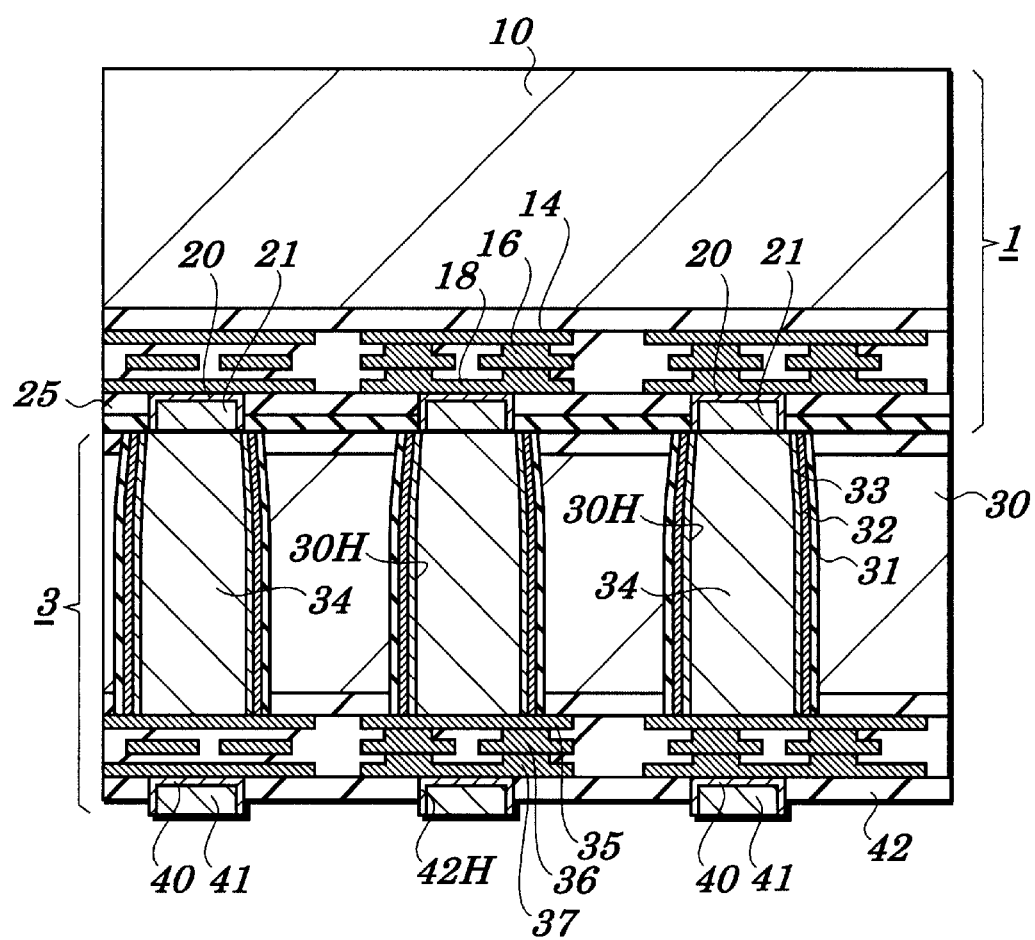
FIG. 4 is an enlarged cross section of a part of the semiconductor device of FIG. 3.

The semiconductor device 2 has a first structure as shown in FIG. 3 and FIG. 4, and comprises at least a multiple wiring substrate 5, an interposer 3 arranged on the multiple wiring substrate 5, and the semiconductor chip 1 on the interposer 3.

Although not shown in detail, the multiple wiring substrate 5 includes a substrate body 51, and is provided with a plurality of electrodes (internal electrodes) 52 on the substrate body 51 (on the upper surface thereof shown in FIG. 3). The substrate body 51 may be a ceramics substrate, a silicon carbide substrate, an epoxy group resin substrate or the like.

The interposer 3 functions as an intermediate wiring substrate provided between the multiple wiring substrate 5 and the semiconductor chip 1, and has at least an interposer body 30, plug holes 30H extending through the interposer body 30, insulating films 31 covering inner surfaces of the plug holes 30H, barrier metal films 32 extending over the insulating films 31, plating seed films 33 on the barrier metal films 32, plugs 34 fitted in the plug holes 30H and being in contact with the plating seed films 33, first wirings 35 on the surface of the interposer body 30, second wirings 36 on the first wirings 35, and external connection electrodes (third wirings) 37 on the second wirings 36. Further, UBM films 40 and bump electrodes 41 are provided on the external connection electrodes 37, both of which are identical to the UBM films 20 and bump electrodes 21 of the foregoing semiconductor chip 1.

The interposer body 30 may be a single silicon substrate which has a thermal expansion coefficient equal to that of the semiconductor substrate 10 of the semiconductor chip 1 and can be manufactured by the procedure for the semiconductor chip 1. The plugs 34 may be Cu plugs having excellent electric conductivity. The Cu plugs are made by the electrolytic process on the inner surfaces of the plug holes 30H using the plating seed films 33, are fitted in the plug holes 30H, and function as wirings extending through the interposer 3.

On the front surface of the interposer 3, each plug 34 has its one end electrically connected to each first wiring 35. On the rear surface of the interposer 3, the other end of each plug 34 is electrically connected to the external connection electrode 18 of the semiconductor ship 1 via the bump electrode 21 and the UBM film 20. In the semiconductor device 2, the semiconductor chip 1 is mounted on the multiple wiring substrate 5 with an integrated circuit mounting surface of the semiconductor chip 1 facing the interposer 3 and the multiple wiring substrate 5, i.e. the FC mounting method is employed.

The first and second wirings 35 and 36, and external connection electrodes 37 are constituted by Cu films or Cu alloy films. Needles to say, Al films or Al alloy films are also usable. Insulating films are provided between the first and second wirings 35 and 36, and between the second wirings 36 and the external connection electrodes 37, and connection holes are made between the forgoing members. The insulating films and connection holes are structured similarly to those of the semiconductor chip 1, and will not be described here.

UBM films 40 and bump electrodes 41 on the external connection electrode 37 are identical to the UBM film 20 and bump electrode 21 in their configuration and material. Each UBM film 40 is in the shape of a recess, and houses each bump electrode 41 therein, and surround the surface and bottom of the bump electrode 41.

A part of the bump electrode 41 in contact with the external connection terminal 37 is embedded in a bump aperture 42H of an insulating film 42 via the UBM film 40.

The bump electrode 41 of the interposer 3 is electrically and mechanically connected to an electrode 52 of the multi-layer wiring substrate 5 via a solder bump electrode 6. The solder bump electrode 6 may be made of a two-component alloy such as Sn—Pb, Sn—Ag, Sn—Zn or Sn—Cu, a three-component alloy such as Sn—Ag—Cu, or a four-component alloy or more component alloy, for example.

[Method of Manufacturing Interposer]

The interposer 3 will be manufactured as shown in FIG. 5(A) to FIG. 5(E).

Figure 5A:
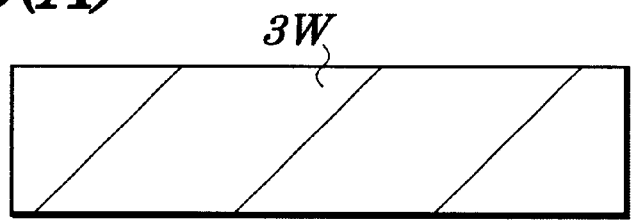
FIG. 5(A) to FIG. 5(E) are cross sections showing how an interposer is made in the semiconductor device of FIG. 3 and FIG. 4.

(1) First of all, a semiconductor wafer 3W is prepared as an interposer body 30 as shown in FIG. 5(A). The semiconductor wafer 3W may be a silicon single crystal wafer which is several hundred $\mu$m thick.

Figure 5B:
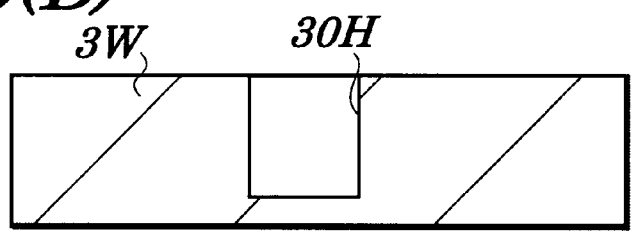

(2) Referring to FIG. 5(B), a plug hole 30H is formed in the semiconductor wafer 3W from the top thereof by anisotropic etching such as RIE. The plug hole 30H has a diameter of 30 $\mu$m, and is 60 $\mu$m deep. Alternatively, the plug hole 30H has different dimensions.

Figure 5C:
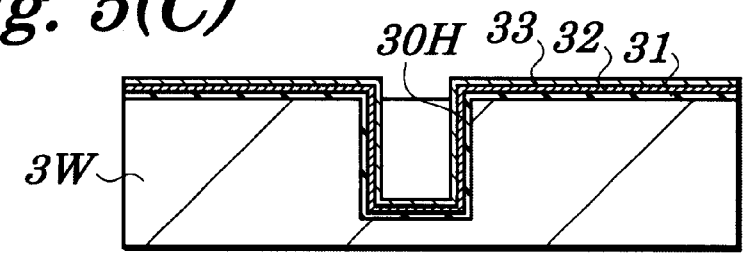

(3) An insulating film 31, a barrier metal film 32 and a plating seed film 33 are formed one over after another on the semiconductor wafer 3W and on an inner surface and bottom of the plug hole 30H. Refer to FIG. 5(C).

Figure 5D:
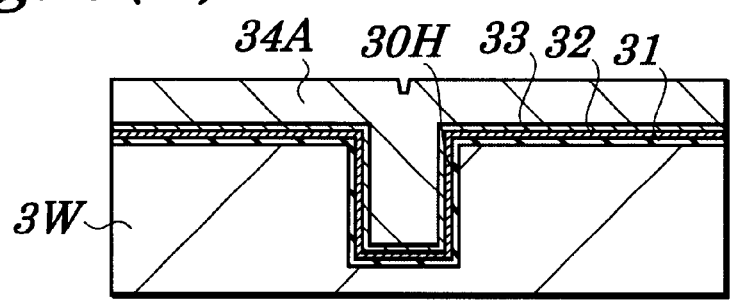

(4) As shown in FIG. 5(D), a plug forming film 34A is formed on the plating seed film 33 in order to cover the plug hole 30H. The plug forming film 34A is a Cu film which is obtained by electrolytic plating and using the plating seed film 33 as a feeding film.

Figure 5E:
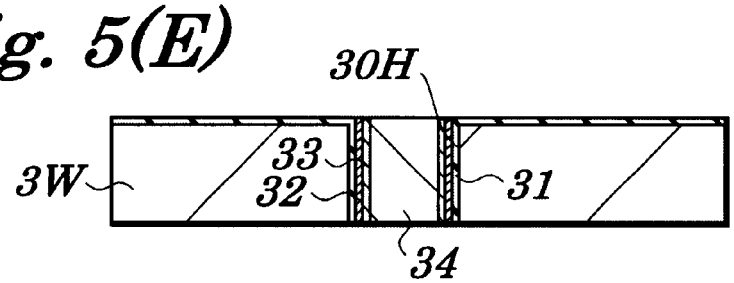

(5) Referring to FIG. 5(E), at least the plug forming film 34A, plating seed film 33 and barrier metal film 32 are removed, by the CMP, at portions except for the plug hole 30H, so that a plug 34 is prepared in the plug hole 30H.

(6) Thereafter, the first and second wirings 35 and 36, and external connection terminal 37 (a third wiring) and so on are prepared by the damascene process. Refer to FIG. 4.

(7) The UBM film 40 and bump electrode 41 are formed on the external connection electrode 37 on the semiconductor wafer 3W, similarly to the UBM film 20 and bump electrode 21 of the semiconductor chip 1. Refer to FIG. 3 and FIG. 4.

(8) The semiconductor wafer 3W is thinned by grinding and the CMP at the rear surface thereof in order that the plug 34 is exposed from the rear surface. In this state, the semiconductor wafer 3W is approximately 60 $\mu$m thick.

(9) The semiconductor wafer 3W is then diced, thereby obtaining the interposer 3 as shown in FIG. 3 and FIG. 4.

Second Structure of Semiconductor Device

Figure 7:
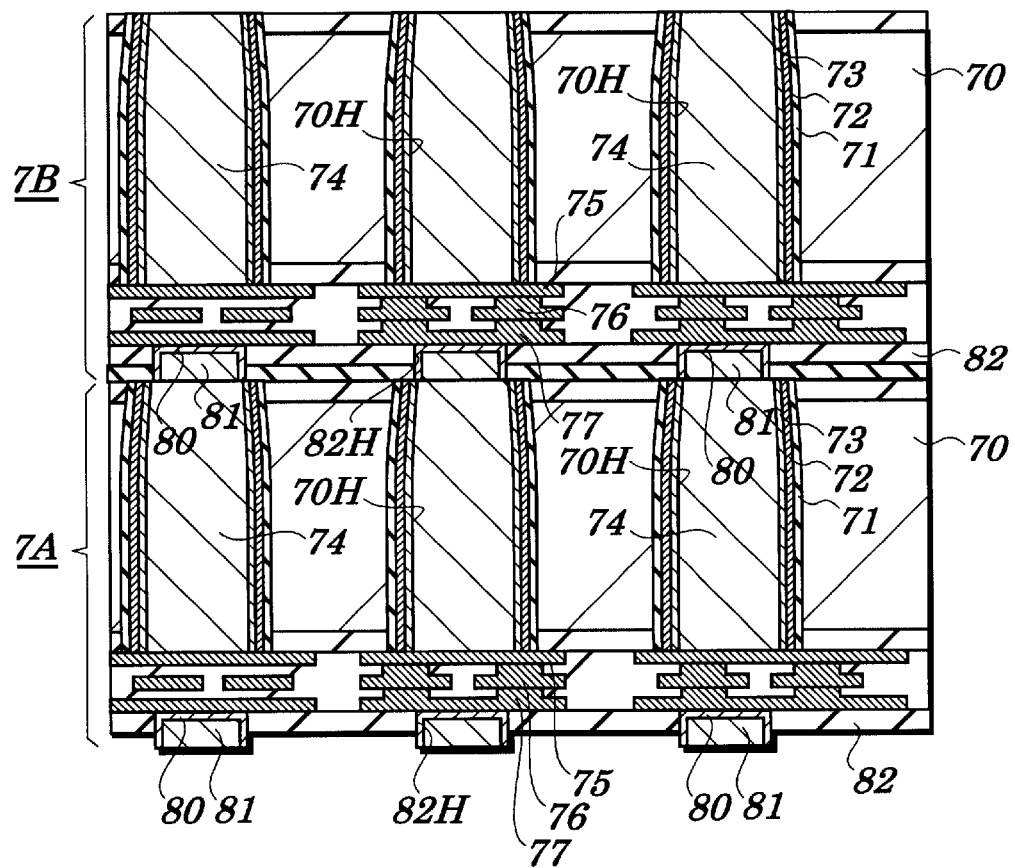
FIG. 7 is an enlarged cross section of a part of the semiconductor device of FIG. 6.

A semiconductor device 2 has a three-dimensional structure as shown in FIG. 6 and FIG. 7, and comprises at least a multiple wiring substrate 5, semiconductor chips 7A, 7B and 7C stacked on the multiple wiring substrate 5 one over after another, and a semiconductor chip 1 described previously.

The multiple wiring substrate 5 and semiconductor chip 1 are fundamentally identical to those described with respect to the first structure, and will not be described her.

The semiconductor chips 7A, 7B and 7C are identical one another, and are configured similarly to the interposer 3 shown in FIG. 3 and FIG. 4. Specifically, each of the semiconductor chips 7A, 7B and 7C comprises at least: a semiconductor substrate 70 made of a silicon single crystal substrate; a plug hole 70H extending through the semiconductor substrate 70 (refer to FIG. 7); an insulating film 71 extending over an inner surface of the plug hole 70H; a barrier metal film 72 on the insulating film 71; a plating seed film 73 on the barrier metal film 72; a plug 74 fitted in the plug hole 70H and being in contact with the plating seed film 73; a first wiring 75 on the semiconductor substrate 70; a second wiring 76 on the first wiring 75; and an external connection electrode 77 (a third wiring) on the second wiring 76.

Although not shown, each of the semiconductor chips 7A, 7B and 7C includes an element on the surface thereof. The element is used to constitute an integrated circuit similarly to the element 12 of the foregoing semiconductor chip 1. Further, each of the semiconductor chips 7A, 7B and 7C includes a UBM film 80 and a bump electrode 81 on an external connection electrode 77. The UBM film 80 and bump electrode 81 are identical to the UBM film 20 and bump electrode 21 of the semiconductor chip 1.

The external connection electrodes 77, bump electrodes 81 of semiconductor chips 7A, 7B and 7C, the external connection electrode 18 and the bump electrode 21 of the semiconductor chip 1 are arranged in the shape of a lattice all over the semiconductor substrates 70 and 10. Alternatively, it is possible to arrange the external connection terminals 77 and bump electrodes 81 only on peripheral areas of the semiconductor substrates 70 and 10.

The plug 74 may be a Cu plug having excellent conductivity, similarly to the plug 34 of the interposer 3, and is prepared on the inner wall of the plug hole 70H using the plating seed film 73. The plug 74 is fitted in the plug hole 70H and extends through the semiconductor substrate 70.

The first and second wirings 75 and 76 and external connection electrode 77 are made of a Cu film or a Cu alloy film. Alternatively, these wirings may be made of an Al film or an Al arroy film. Insulating films or connection holes are provided between the first and second wirings 75 and 76, and between the second wiring 76 and the external connection electrode 77. The insulating films and connection holes are configured similarly to those of the semiconductor chip 1, and will not be described here.

The UBM film 80 on the external connection electrode 77 is in the shape of a recess, and the bump electrode 81 is fitted in the UBM film 80 with its outer surface and bottom surrounded thereby. The UBM film 80 and bump electrode 81 are identical to the UBM film 20 and bump electrode 21 of the semiconductor chip 1.

A part of the bump electrode 81 in contact with the external connection electrode 77 is fitted in a bump aperture 82H of an insulating film 82 via the UBM film 80.

The lowermost semiconductor chip 7A is mounted via its front surface on a front surface of the multiple wiring substrate 5 (refer to FIG. 6 and FIG. 7), i.e. the FC mounting method is employed. The external connection electrode 77 of the semiconductor chip 7A is electrically and mechanically connected to an electrode 52 of the multiple wiring substrate 5 via the bump electrode 81.

The second semiconductor chip 7B is mounted via its front surface on a rear surface of the semiconductor chip 7A (refer to FIG. 6 and FIG. 7), i.e. the FC mounting method is employed. The external connection electrode 77 of the semiconductor chip 7B is electrically and mechanically connected to a plug 74 of the semiconductor chip 7A via the bump electrode 81.

The third semiconductor chip 7C is mounted via its front surface on a rear surface of the semiconductor chip 7B (refer to FIG. 6 and FIG. 7), i.e. the FC mounting method is employed. The external connection electrode 77 of the semiconductor chip 7C is electrically and mechanically connected to a plug 74 of the semiconductor chip 7B via the bump electrode 81.

The uppermost semiconductor chip 1 is mounted via its front surface on a rear surface of the semiconductor chip 7C (refer to FIG. 6 and FIG. 7), i.e. the FC mounting method is employed. The external connection electrode 18 of the semiconductor chip 1 is electrically and mechanically connected to the plug 74 of the semiconductor chip 7C via the bump electrode 21.

The semiconductor device 2 is not only as advantageous as the semiconductor chip 1 but also has the following features. The semiconductor chips 7A to 7C are vertically stacked one over after another on the multiple wiring substrate 5, which is effective in making the semiconductor device 2 further compact. The semiconductor chip 7A is electrically and mechanically connected via the plug 74 thereof to the semiconductor chip 7B. Further, the semiconductor chip 7B is electrically and mechanically connected via the plug 74 thereof to the semiconductor chip 1. Therefore, it is possible to reduce connection routes between the upper and lower semiconductor chips, and to accelerate circuit operation.

Second Embodiment of the Invention

A second embodiment of the invention relates to an improvement of the foregoing semiconductor device manufacturing method in order to control the thickness of the insulating film 25 of the semiconductor chip 1 more effectively. A semiconductor device 2 will be manufactured by the following processes, shown in FIG. 8(A) to FIG. 8(D).

(1) First of all, a semiconductor wafer 10W is prepared as in the first embodiment. See FIG. 8(A).

Figure 8A:
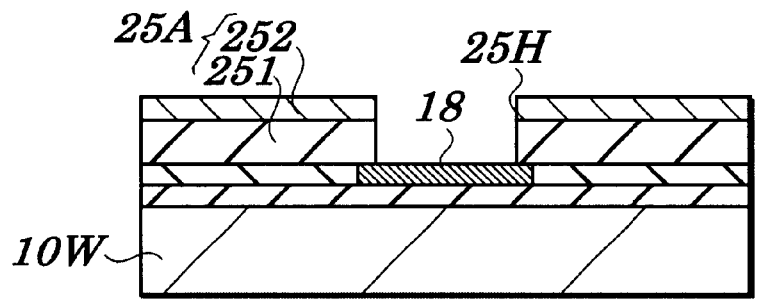
FIG. 8(A) to FIG. 8(D) are cross sections showing how a bump electrode is made in the semiconductor device in a second embodiment of the invention.

(2) Referring to FIG. 8(A), an insulating film 25A is formed on an external connection electrode 18 on the semiconductor wafer 10W, and has a bump aperture 25H. The insulating film 25A includes at least first and second insulating films 251 and 252. The second insulating film 252 is present on the first insulating film 251 and has an etching ratio different from that of the first insulating film 251. The first insulating film 252 may be a non-organic film such as a silicon oxide film or a silicon nitride film prepared by the plasma CVD process, and is 1.0 μm thick. The second insulating film 252 may be an organic film such as a polyimide group resin prepared by the spin coating process, and is 5 μm thick. The bump aperture 25H is made by the photolithography or etching process, similarly to the manufacturing method in the first embodiment.

Figure 8B:
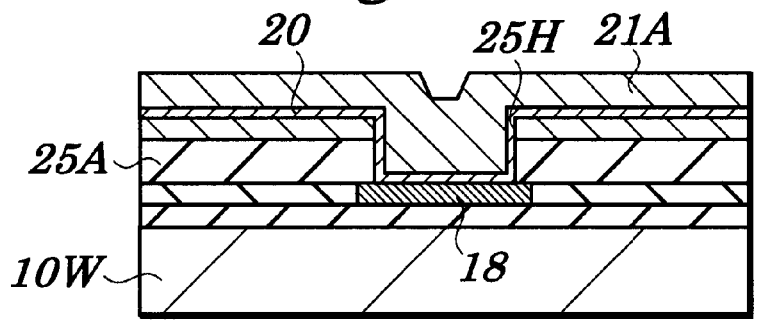

(3) A UBM film 20 is applied on the insulating film 25, an inner wall of the bump aperture 25H, and the external connection electrode 18, i.e. full face on the semiconductor wafer 10W. Refer to FIG. 8(B).

(4) A bump electrode film 21A is applied onto the UBM film 20 in order to cover at least the bump aperture 25H, as shown in FIG. 8(B).

Figure 8C:
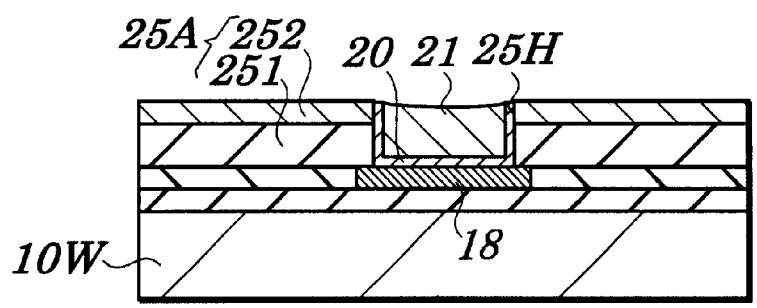

(5) Referring to FIG. 8(C), the bump electrode film 21A and UBM film 20 are removed by the CMP from positions except for the bump aperture 25H. A bump electrode 21 is formed in the bump aperture 25H, and is surrounded by the UBM film 20 on the inner wall of the bump aperture 25H and the external connection electrode 18.

Figure 8D:
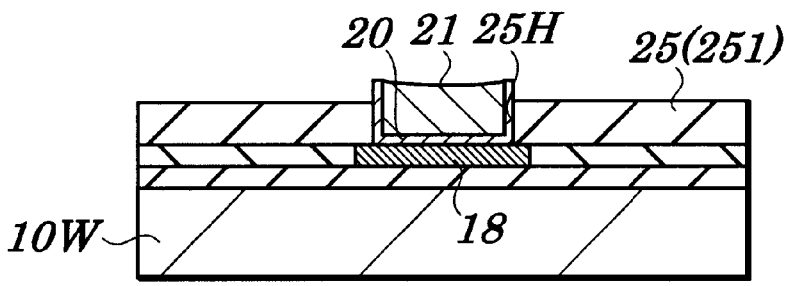

(6) A part of the insulating film 25A, i.e. the second insulating film 252, is selectively dry-etched or wet-etched, so that the UBM film 20 and the bump electrode 21 stick out. The first insulating film 251 is at a lower level than the UBM film 20 and bump electrode 21, and serves as an insulating film 25. When the second insulating film 252 is an organic resin film, it can be easily removed using a plasma asher. Refer to FIG. 8(D).

Figure 2E:
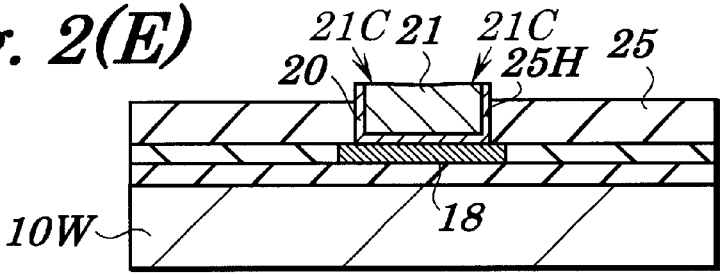

(7) The bump electrode 21 is chamfered and processed as described with the process shown in FIG. 2(E) related to the first embodiment. The semiconductor wafer 10W includes the bump electrode 21 electrically and mechanically connected to the external connection electrode 18 via the UBM film 20 and partially surrounded by the insulating film 25.

(8) The semiconductor wafer 10W is diced, thereby obtaining the semiconductor chip 1 as shown in FIG. 1. The semiconductor chip 1 is mounted on a multiple wiring substrate 5 as shown in FIG. 4, FIG. 6 and FIG. 7, so that the semiconductor device 2 is completed.

In the second embodiment, the insulating film 25A is constituted by the first and second insulating films 251 and 252 which have the different etching ratios. The second insulating film 252 is selectively etched, so that a part of the insulating film 25A is uniformly removed on the semiconductor wafer 10W.

Third Embodiment of the Invention

A third embodiment relates to a method which is essentially identical to the manufacturing method in the first embodiment, but differs therefrom in materials of UBM film 20 and bump electrode 21 of the semiconductor chip 1. In this embodiment, a minute Sn bump electrode which is 10 μm thick and 1 μm high will be made as shown in FIG. 9(A) to FIG. 9(E).

Figure 9A:
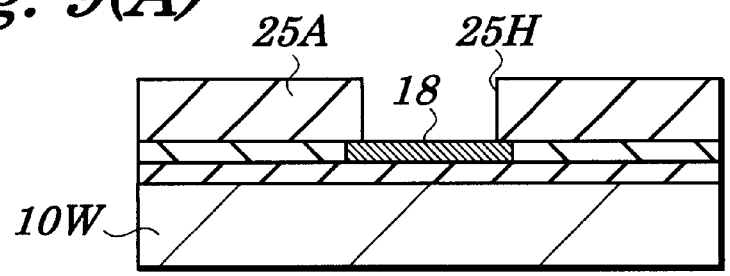
FIG. 9(A) to FIG. 9(E) are cross sections showing how a bump electrode is made in the semiconductor device in a third embodiment of the invention.

(1) A semiconductor wafer 10W is prepared as shown in FIG. 9(A).

(2) An insulating film 25A is applied onto the semiconductor wafer 10W, and has a bump aperture 25H on an external connection electrode 18. Refer to FIG. 9(A).

Figure 9B:
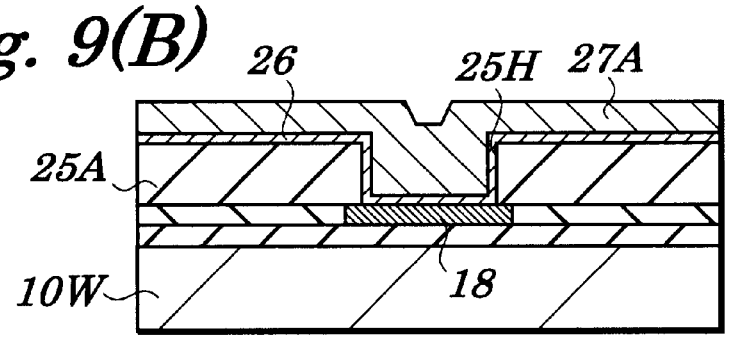

(3) A UBM film 26 is applied on the insulating film 25A, an inner wall of the bump aperture 25H, and the external connection electrode 18, i.e. full face on the semiconductor wafer 10W. Refer to FIG. 9(B). The UBM film 26 is constituted by an approximately 50 nm to 100 nm thick titanium (Ti) film, and an approximately 150 nm to 300 nm thick Ni film, which are prepared by continuous sputtering. The UBM film 26 has substantially uniform thickness on the inner wall of the bump aperture 25H and the external connection electrode 18.

(4) A bump electrode film 27a is applied on the UBM film 26 in order to cover at least the bump aperture 25H. The bump electrode film 27A is an Sn film prepared by the electrolytic plating and using the UBM film 26 as a feeding film. The Sn film is approximately 2 µm to 5 µm thick. Refer to FIG. 9(B).

Figure 9C:
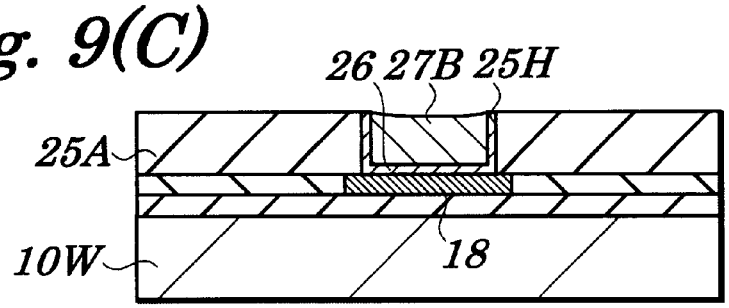
Figure 9D:
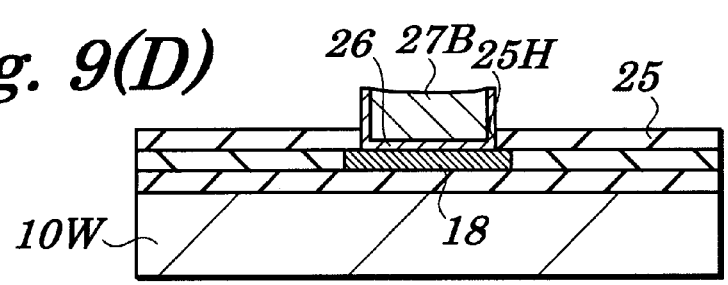
Figure 9E:
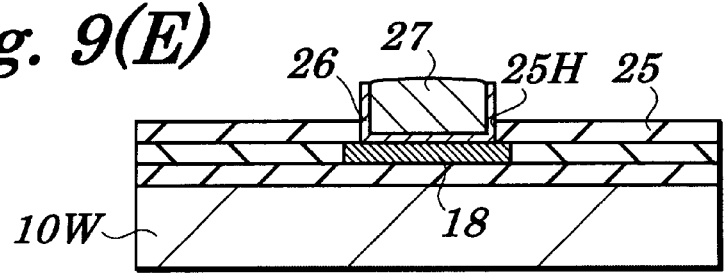

(5) Referring to FIG. 9(C), the bump electrode film 27A and UBM film 26 are removed by the CMP process from positions except for the bump aperture 25H. A bump electrode 27B is formed in the bump aperture 25H, and is surrounded by the UBM film 26 on the inner wall of the bump aperture 25H and the external connection electrode 18.

(6) A part of the insulating film 25A is selectively dry-etched or wet etched, so that the UBM film 26 and the bump electrode 27B stick out. The insulating film 25A is at a lower level than the UBM film 26 and bump electrode 27, and serves as an insulating film 25. The insulating film 25A is removed by an amount of approximately 5 µm, and the insulating film 25 is finally 1.5 µm thick, for example. Refer to FIG. 8(D).

(7) As shown in FIG. 19(E), solder reflowing is performed for the bump electrode 27B at approximately 200° C. to 280° C., thereby obtaining a bump electrode 27 having a somewhat rounded edge.

(8) The semiconductor wafer 10W will be completed after the foregoing processes, and includes the bump electrode 27 electrically and mechanically connected via the UBM film 26.

(9) The semiconductor wafer 10W is diced, thereby obtaining the semiconductor chip 1 as shown in FIG. 1.

(10) The semiconductor chip 1 is mounted on a multiple wiring substrate 5 as shown in FIG. 3, FIG. 4, FIG. 6 and FIG. 7, so that the semiconductor device 2 is completed.

The manufacturing method of the third embodiment is as advantageous as the manufacturing method of the first embodiment. The bump electrode 27B has its side and bottom surrounded by the UBM film 26, i.e. the UBM film 26 keeps the bump electrode 27B in good shape (serves as a dam). Therefore, even when solder reflowing is performed for the bump electrode 27B, the UBM film 26 prevents flow out of the material (Sn) of the bump electrode 27B. This is effective in keeping the bump electrode 27 in good shape.

In the semiconductor device 2 obtained by the method of the third embodiment, adjacent bump electrodes 27 are protected against short-circuiting which might be caused by the material flowing from the bump electrode 27B during the solder reflowing. Further, it is possible to improve electrical reliability of the bump electrodes 27, and arrange the bump electrodes 27 with fine pitches, and increase the number of terminals.

The UBM film 26 in the shape of a recess has suitable mechanical strength. The bump electrodes 27 are very slow to be deformed and can have uniform height, which is effective in improving electrical reliability with other electrodes such as plug 34 of the interposer (shown in FIG. 6 and FIG. 7), or an electrode 52 of the multiple wiring substrate 5 on the bump electrodes 27, and plugs 74 of the semiconductor chips 7A to 7C, shown in FIG. 6 and FIG. 7.

Fourth Embodiment of the Invention

Fourth embodiment relates to how to join first and second electrodes on first and second substrates in a semiconductor device.

The first substrate may be a semiconductor substrate, and the second substrate may be a semiconductor substrate, a wiring substrate or the like. The first and second electrodes are joint electrodes (bonding electrodes). At least one of the first and second electrodes is preferably shaped to stick out of a surface of the substrate.

For example, the first or second electrode may be a bump electrode, or a land. In the latter case, the first or second electrode is shaped to stick out of the surface of the substrate in order to facilitate joint. The land is constituted by a conductive pattern which sticks out compared with a peripheral area, so that it is not necessary to shape the land in order to stick out so long as electrodes are in contact with one another and can be joined.

Further, it is assumed that a through plug which is provided in a semiconductor substrate (e.g. a semiconductor chip) or an another semiconductor substrate is used as the first or second electrode. In such a case, the through plug can stick out of the semiconductor substrate by selectively removing the surface of the semiconductor substrate.

The first or second electrode preferably contains at least one of Cu, Ni, Au and Ag, or a plurality of alloys. The foregoing metal is usually used as a material for joint electrodes. Especially, Cu, Ni and Ag tend to generate oxide compounds while Au attracts organic substances. These materials are preferable to the electrodes.

The method of the fourth embodiment includes sticking a solvent at least to either the first or second electrode. In this case, the solvent preferably contains at least non-organic acid or organic acid in order to efficiently remove oxides or the like.

The solvent is activated by resistance heating or irradiating infrared beams, electron beams or laser beams, depending upon the structure of the semiconductor device and a method of supplying activation energies.

[Structure and Operation of Semiconductor Manufacturing System]

A semiconductor manufacturing system (e.g. a flip chip bonder) 300 is usable in order to manufacture the semiconductor device of the fourth embodiment. Refer to FIG. 10.

The semiconductor manufacturing system 300 includes a stage 301, a head 309, and charge coupled device (CCD) cameras 305 and 306. On the stage 301 is placed a semiconductor chip 303, which constitutes a semiconductor device, is joined as a first substrate, and is a high speed DRAM (dynamic random access memory) chip. The head 309 holds a semiconductor chip 307, which constitutes the semiconductor device, is joined as a second substrate, and is a logic chip. Although not shown in detail, the semiconductor chips 303 and 307 are mainly made of semiconductor substrates 10, similarly to the semiconductor chip 1 shown in FIG. 1.

The stage 301 is provided with an adsorbing section of a vacuum adsorbing system 320, and detachably adsorbs and holds the semiconductor chip 303. Further, the head 309 has another adsorbing section of the vacuum adsorbing system 320, and detachably adsorbs and holds the semiconductor chip 307.

A conveyer robot 321 delivers and receives the semiconductor chip 303 to and from the stage 301. Further, a conveyer robot 322 delivers and receives the semiconductor chip 37 to and from the head 309.

At least the stage 301 or the head 302 is connected to a position adjusting mechanism 323, to which the CCD cameras 305 and 306 are connected. The position adjusting mechanism 323 adjusts the positions of the semiconductor chips 303 and 307 placed on the stage 301 and the head 309, respectively.

Specifically, the CCD camera 305 takes a picture of an electrode 304 on the semiconductor chip 303 on the stage 301. The position adjusting mechanism 323 calculates position data of the first electrode 304 on the basis of an image, and calculates position data of the second electrode 308 on the basis of an image of the second electrode 308 obtained by the CCD camera 308. Thereafter, the position adjusting mechanism 323 moves at least either the stage 301 or the head 309 on the x-y plane on the basis of the position data, adjusts an inclination θ around the axis z, and aligns the first and second electrodes 304 and 308.

The CCD cameras 305 and 306 are coupled to a camera moving mechanism 324. Once the first and second electrodes 304 and 308 are aligned, the camera moving mechanism 324 withdraws the CCD cameras 305 and 306 from the stage 301 and the head 309.

The semiconductor manufacturing system 300 further includes a solvent injector 330 and an injection-movement controlling mechanism 331 connected to the solvent injector 330. The solvent injector 330 is substantially in the shape of a syringe, and injects the solvent onto the first electrode 304 or the second electrode 308. The injection-movement controlling mechanism 331 lets the solvent injector 330 scans the semiconductor chip 303 between the stage 301 and head 309, i.e. on the semiconductor chip 303, and controls an amount of the solvent to be injected by the solvent injector 330. In this state, the solvent injector 330 is not in contact with the first electrode 304.

Prior to joining the first and second electrodes 304 and 308, the solvent has to be activated at a melting point temperature which is below a temperature where the first or second electrode 304 or 308 melts. Further, the solvent should be heat-cured after the first and second electrodes 304 and 308 are joined.

The position adjusting mechanism 323 can move at least either the stage 301 or the head 309 along the axis z. After the movement of the stage 301 or the head 309 and injection of the solvent to the first electrode 304, the first and second electrodes 304 and 308 are compressed via the solvent.

The stage 301 has a heater 302 therein while the head 309 has a heater 310 therein. These heaters 302 and 310 heat the solvent in order to promote activation of the solvent.

The jointing area of the stage 301 and the head 309 may be exposed to the air, but is preferably maintained in an inert gas such as an $N_2$ or Ar gas.

Further, an ultrasonic generator may be connected at least to the stage 301 or the head 309 in order to improve the joint between the first and second electrodes 304 and 309.

[Method of Manufacturing Semiconductor Device]

Figure 11:
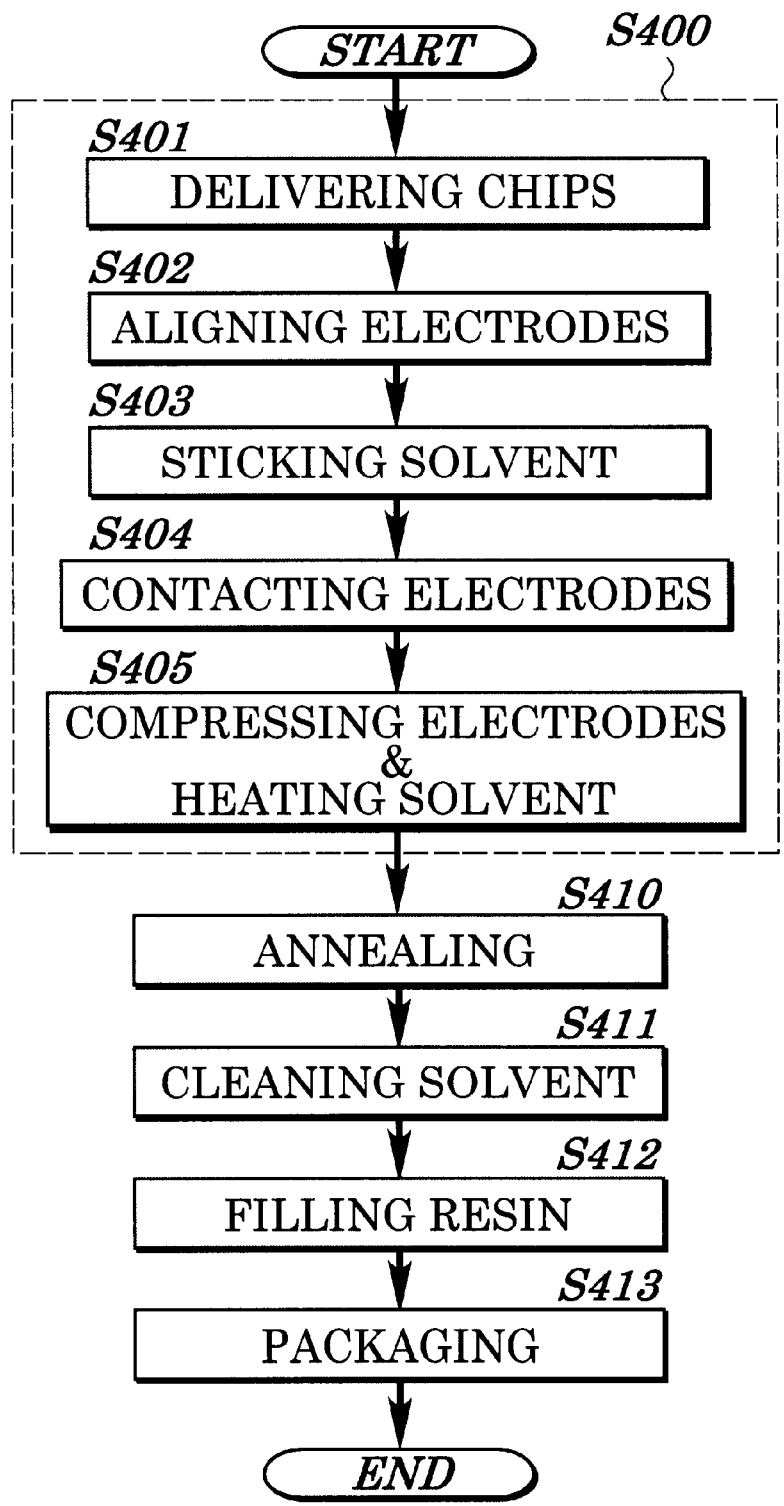
FIG. 11 is a flowchart showing processes of the semiconductor device of the fourth embodiment.

The semiconductor device of this embodiment will be manufactured by the semiconductor manufacturing system 300 according to a procedure shown in FIG. 11.

Figure 12:
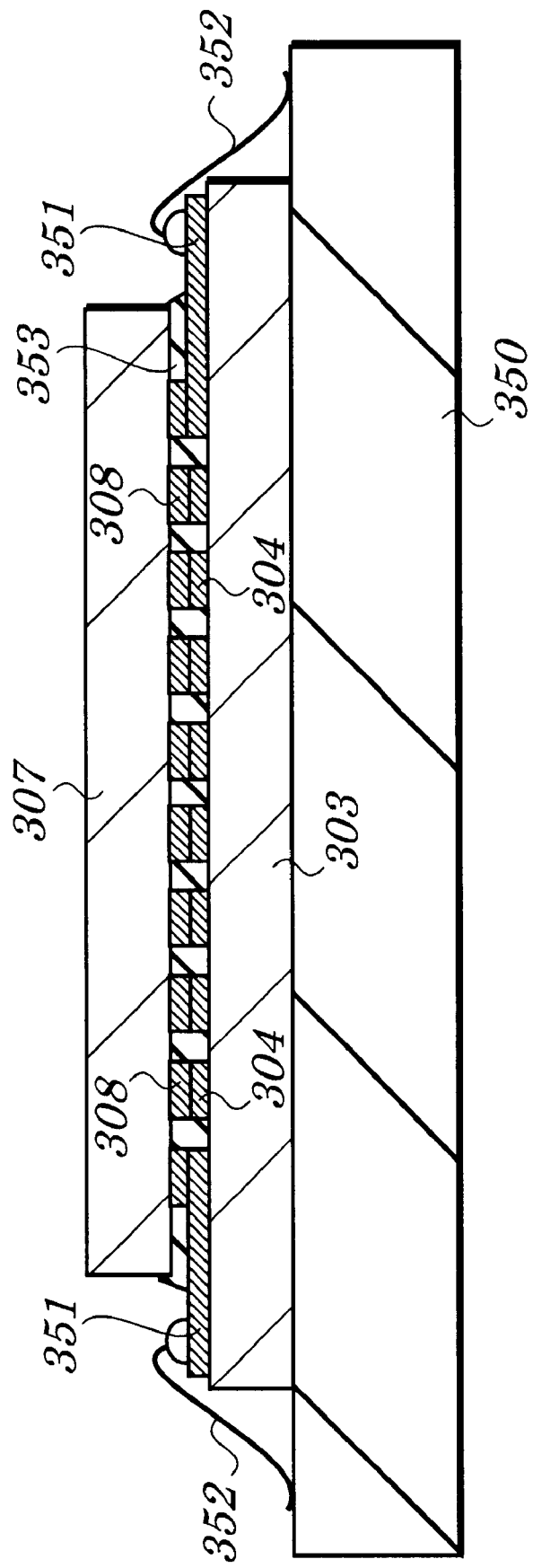
FIG. 12 shows a configuration of a semiconductor device in the fourth embodiment of the invention.

Referring to FIG. 10 and FIG. 12, circuit mounting surfaces of the semiconductor chip 303 (high speed DRAM chip) and the semiconductor chip 307 (log chip) face with each other and are stuck in the semiconductor device. In other words, the semiconductor substrates are joined each other, i.e. between the first electrode 304 of the semiconductor chip 303 and the second electrode 308 of the semiconductor chip 307. Signals such as clock signals, control signals and data signals can be transmitted at an accelerated speed between the semiconductor chips 303 and 307, so that the semiconductor device can operate circuits, and read and write data at accelerated speeds.

(1) The first and second electrodes 304 and 308 of the semiconductor chips 303 and 307 are joined at the atmospheric room pressure and in an inert gas such as $N_2$ or Ar, using the semiconductor manufacturing system 300 (S400). Alternatively, the electrodes 304 and 308 may be joined in the air.

Prior to the joining process, at least the first or second electrode 304 or 308 is suitably shaped so as to promote joining. For instance, with the semiconductor chip 307, the second electrode 308 in a wafer state is in the shape of a bump. The second electrode 308 is mainly made of Cu, is a square of 5 $\mu$m, and has an arranging pitch of 10 $\mu$m. Further, approximately hundred thousand second electrodes 308 are arranged per chip.

The semiconductor chip 303 includes the first electrode 304 which is as large as the second electrode 308 of the semiconductor chip 307, and has an arranging pitch equal to that of the second electrode 308. The first electrode 304 is mainly made of Cu similarly to the second electrode 308.

The first and second electrodes 304 and 307 may be Cu bump electrodes.

In the semiconductor manufacturing system 300, the stage 301 and the head 309 are spaced. A conveyer robot 321 delivers the semiconductor chip 303 to the stage 301, and a conveyer robot 322 delivers the semiconductor chip 307 to the head 309 (S401). The stage 301 and the head 309 are reliably kept parallel to the x-y plane (the horizontal plane), and not inclined to the x-y plane.

The CCD camera 305 takes a picture of the first electrode 304 on the stage 301, and outputs position data of the first electrode 304 to the position adjusting mechanism 323. Further, the CCD camera 306 takes a picture of the second electrode 308 on the head 309, and outputs position data of the second electrode 308 to the position adjusting mechanism 323. The position adjusting mechanism 323 moves the stage 301 or the head 309 on the x-y plane, adjusts the inclination θ, and aligns the first and second electrodes 304 and 308 (S402). Alignment of the electrodes 304 and 308 may be performed by an optical positioning unit using laser beams in place of the CCD cameras.

The injection-movement controlling mechanism 331 lets the injector 330 scan the semiconductor chip 303. The injector 330 injects the solvent all over the first electrode 304 and sticks it onto the first electrode 304 (S403). In this embodiment, the solvent is stuck only onto the first electrode 304. Alternatively, the solvent may be stuck onto the second electrode 308, or onto both of the first and second electrodes 304 and 308.

In the foregoing process, the non-activated solvent is stuck onto the first electrode 304. When activated, the solvent melts or reduces at least one of oxide, sulfide, or organic substances stuck onto a metal surface. For instance, the solvent may be isopropyl alcohol, hexylene glycol, polyhedral alcohol or the like which contains an activator such as an organic acid, acetic acid or amino ethanol. Alternatively, non-organic acid such as phosphoric acid, hydrochloride, sulfide or fluoric acid may be included. The solvent may be water soluble or not water soluble. In this embodiment, the solvent is injected and dispensed by the injector 330. So long as the solvent is a fluid, it may be applied using a brush or the like.

The position adjusting mechanism 323 moves at least the stage 301 or the head 309 toward the axis z, thereby bringing the first and second electrodes 304 and 308 into contact with each other via the solvent (S404).

Thereafter, the stage 301 or the head 309 is further moved toward the axis z in order to compress the first and second electrodes 304 and 308 (S405). The heater 302 of the stage 301 and the heater 310 of the head 309 heat the first and second electrodes 304 and 308, respectively. This means that resistance heating is performed. Specifically, heating is performed at a temperature which is lower the melting point temperature of the first or second electrode 304 or 308, which is lower, and until the solvent is activated via the first and second electrodes 304 and 308. For instance, the heating temperature is raised by 10° C. per second until the solvent reaches the activation temperature of 160° C. from the room temperature. The activation temperature is maintained for one minute.

Ultrasonic vibrations may be applied to the first and second electrodes 304 and 308 while the solvent is being activated. Ultrasonic vibrations are effective in promoting removal of oxide films or the like from the first and second electrodes 304 and 308, and exposing a fresh metal surface on the electrodes 304 and 308.

Once joined (S400), the first and second electrodes 304 and 308 are electrically and mechanically connected.

(2) The semiconductor chips 303 and 307 are carried to an annealing unit and are annealed at 250° C. for one hour (S410). The annealing can obviate voids existing at the joined areas of the first and second electrodes 304 and 308, enlarge the joined areas of the electrodes 304 and 308, and increase joining strength. This is effective in improving productivity of the semiconductor device.

(3) The annealed semiconductor chips 303 and 307 are immersed in a cleaning bath filled with a cleaning fluid, and are subject to ultrasonic cleaning, thereby removing the solvent from the electrodes and semiconductor chips (S411).

(4) After the cleaning, an under-fill resin is filled into gaps between the semiconductor chips 303 and 307 (S412), and protects the first and second electrodes 304 and 308 against exposure to the air, and prevents intrusion of water from outside. This is effective in preventing electrical and mechanical aging in response to the lapse of time. Further, the under-fill resin can improve the mechanical strength of the joined areas of the first and second electrodes 304 and 308.

(5) The semiconductor chips 303 and 307 are packaged (S413), so that the semiconductor device of the fourth embodiment will be completed.

In this embodiment, the solvent may be either water soluble or non-water soluble. Needless to say, the cleaning process (S411) may be changed depending upon the quality of the solvent. For example, if the solvent is oil soluble, an organic cleaning fluid may be used.

[Structure of Semiconductor Device]

FIG. 12 shows an example of semiconductor devices manufactured by the method in the fourth embodiment. The semiconductor device includes: a semiconductor chip 303 having a first electrode 304; a semiconductor chip 307 having a second electrode 308; an under-fill resin 353 between the semiconductor chips 303 and 307; a wiring substrate 350 constituting a package; and a wire 352 electrically and mechanically connecting an external electrode 351 of the semiconductor chip 303 to an electrode of the wiring substrate 350.

In this embodiment, the non-activated solvent is stuck onto at least the first electrode 304 or the second electrode 308, and is then activated by heating. The first and second electrodes 304 and 308 are compressed with the activated solvent maintained therebetween. The solvent is activated at the temperature which is lower than the melting point temperatures of the first and second electrodes 304 and 308, and keeps the metal of these electrodes 304 and 308 remain solid. Neither a dangerous gas nor a vacuum unit is necessary, which can simplify a semiconductor manufacturing line, and suppress generation of poor joints between the electrodes 304 and 308. This is because no metal melting is required.

[Modified Examples]

The semiconductor device of the fourth embodiment comprises the semiconductor chip 303 as the high speed DRAM, and the semiconductor chip 307 as the logic chip, both of which are stacked. Alternatively, the semiconductor device may comprise stacked memory chips such as a DRAM and a SRAM (static random access memories), or stacked logic chips.

Further, the present invention is applicable to a semiconductor device comprising three stacked semiconductor chips, i.e. a three-dimensional semiconductor device. In such a case, through plugs will be used as connection electrodes.

The present invention is applicable to joining of electrodes in the wafer before the dicing process.

With respect to the semiconductor manufacturing system 300, the parallelism between the stage 301 and the head 309, positioning precision of the first and second electrodes 304 and 308 in the x and y directions and the inclination θ, dimensions of the electrodes, arranging pitches, the number of electrodes and so on can be determined in accordance with the precision to be satisfied by the semiconductor device to be manufactured.

In the fourth embodiment, the solvent is stuck onto the electrode 304 (S403) and the electrodes 304 and 308 are brought into contact (S404), and the solvent is heated by the heaters 302 and 310 (S405). Alternatively, the solvent may be heated after it is stuck onto the electrode 304, and be activated by heating. Then, the electrodes 304 and 308 may be compressed to be joined. Through experiments, the inventor has noted that it is possible to shorten the compressing process by stacking the solvent onto the electrode, activating the solvent by heating and joining the electrodes. In other words, if it is not necessary to shorten the compressing process, the electrodes can be reliably joined with sufficient mechanical strength.

Further, the solvent may be activated by irradiating infrared rays, electron beams, laser beams or the like in place of the resistance heating.

Fifth Embodiment of the Invention

A fifth embodiment relates a modification of the semiconductor device and the manufacturing method of the fourth embodiment. A solvent which serves as an under-fill resin after being heat-cured is employed in place of the solvent which is cleaned after the electrodes are joined (S405). Therefore, it is possible to obviate the solvent cleaning process and the under-fill resin supplying process.

The solvent which can also serve as the under-fill resin can melt or reduce metal oxide or the like at a temperature which is low but is higher than the room temperature, i.e. approximately 150° C., and is heat-cured at approximately at 250° C. The heat-cured solvent can be in firm contact with the objects to be joined, and preferably prevent water or the like from intruding into the joined portion in a condition where the semiconductor device is used.

[Structure of Semiconductor Device]

Figure 13:
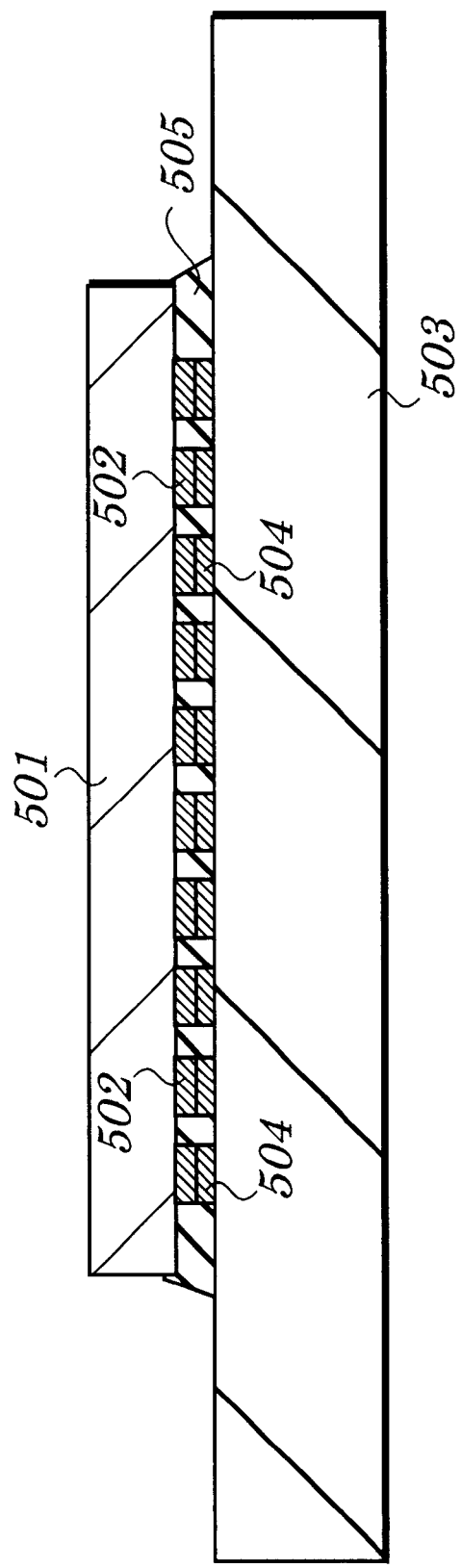
FIG. 13 shows the configuration of a semiconductor device in a fifth embodiment of the invention.

Referring to FIG. 13, the semiconductor device comprises: a wiring substrate 503 which is the first substrate; a first electrode 504 on the wiring substrate 503; a semiconductor chip 501 stacked on the first wiring substrate 503 and functioning as a second substrate; a second electrode 502 on the semiconductor chip 501 and joined to the first electrode 504; an under-fill resin 505 applied between the wiring substrate 503 and the semiconductor chip 501.

The wiring substrate 503 may be a printed circuit board including a glass epoxy resin as a core, a ceramics substrate, a silicon carbide substrate, a glass substrate or a silicon substrate. In addition to first electrode and wiring, the wiring substrate 503 may be mounted on the circuit. Further, the wiring substrate 503 may have a single wiring layer on its front surface, or multiple wiring layers on its rear surface and interior.

The semiconductor chip 501 may be a high speed DRAM chip or a logic chip similarly to the semiconductor device in the fourth embodiment.

[Method of Manufacturing Semiconductor Device]

Figure 14:
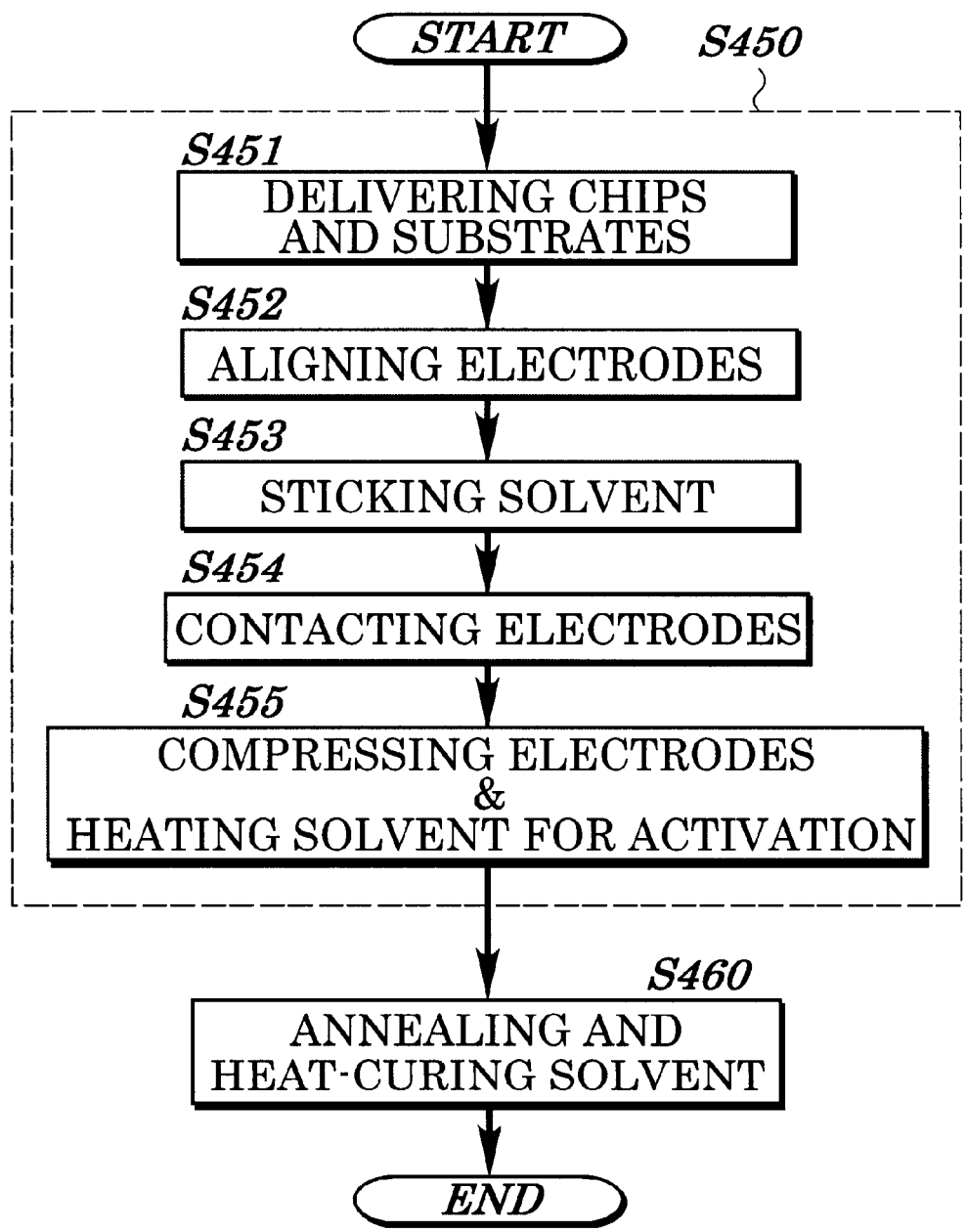
FIG. 14 is a flowchart showing a procedure of the semiconductor device of the fifth embodiment.
Figure 15A:
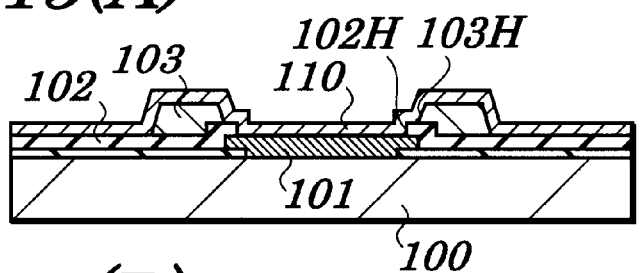
FIG. 15(A) to FIG. 15(D) are cross sections showing how an Au bump electrode is made in a semiconductor device of the related art.
Figure 15B:
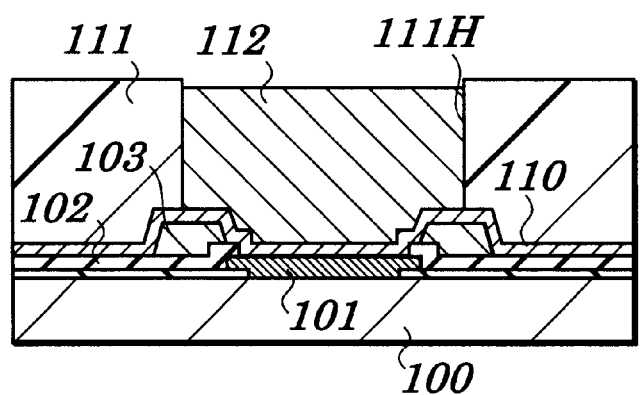
Figure 15C:
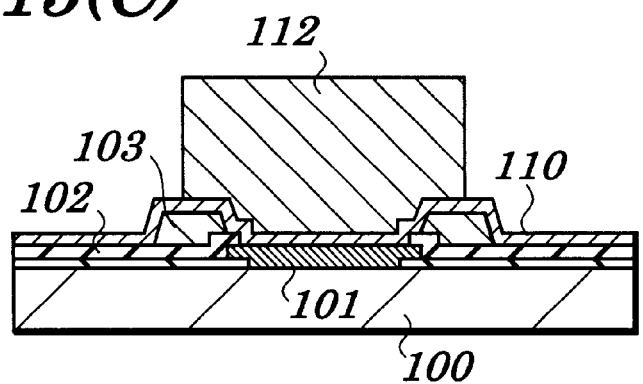
Figure 15D:
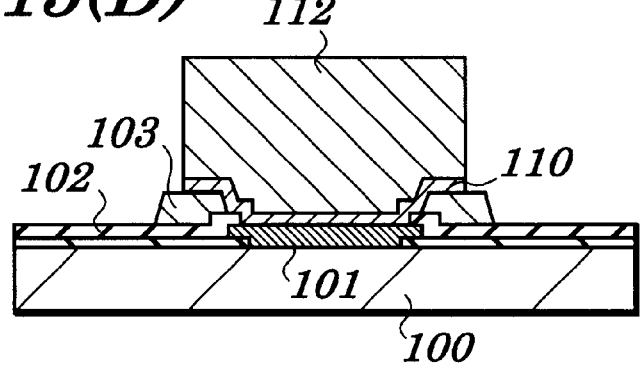
Figure 16A:
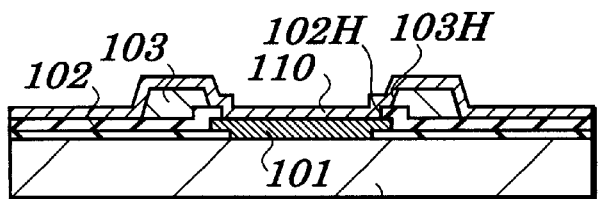
FIG. 16(A) to FIG. 16(E) are cross sections showing how a solder bump electrode is made in a semiconductor device of the related art.
Figure 16B:
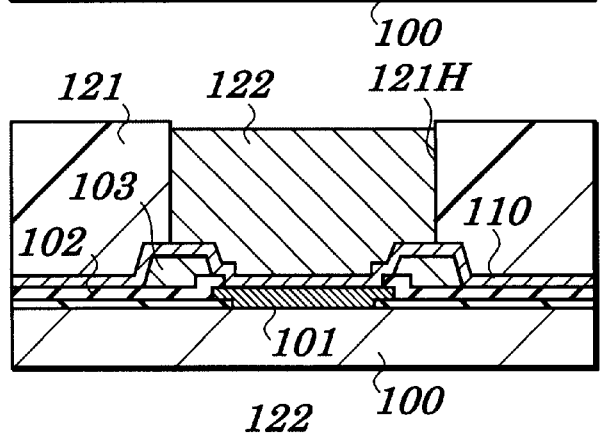
Figure 16C:
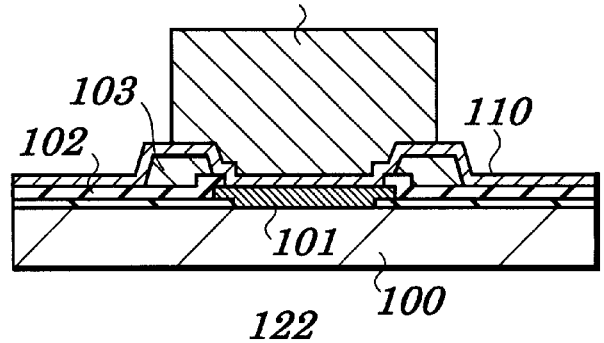
Figure 16D:
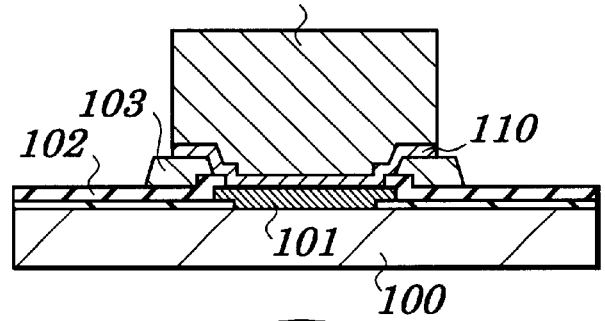
Figure 16E:
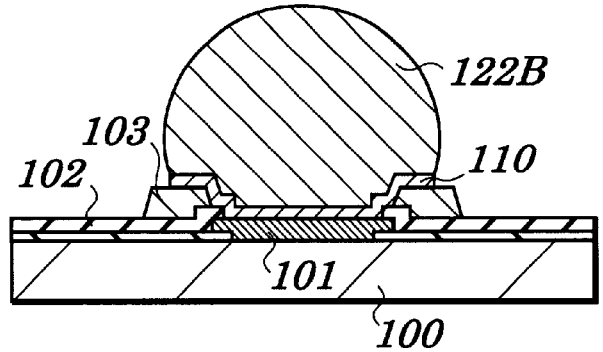
Figure 17:
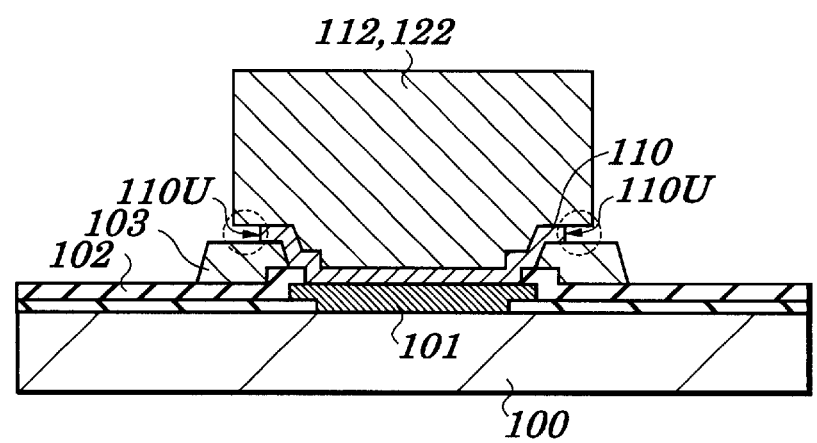
FIG. 17 is an enlarged cross section of a part of the semiconductor device of the related art.
Figure 18:
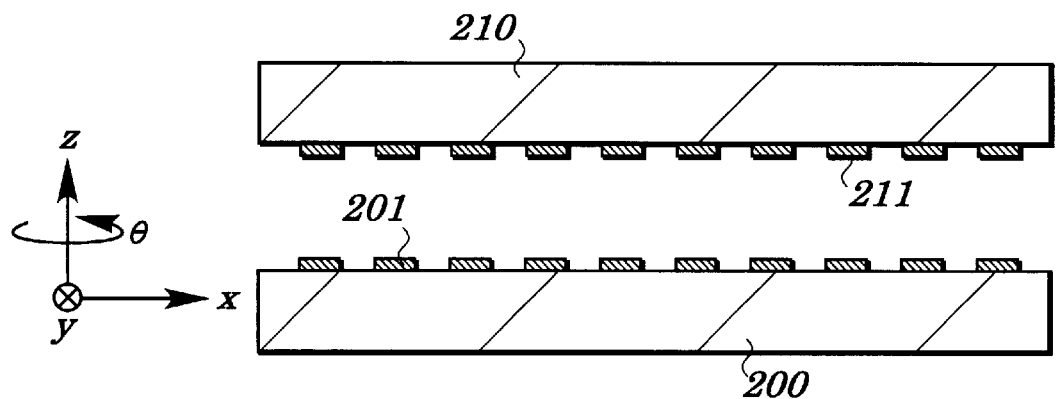
FIG. 18 is a cross section showing how semiconductor devices are joined in the related art.

A semiconductor device of this embodiment will be manufactured by the semiconductor manufacturing system 300 (shown in FIG. 10) according to a procedure shown in FIG. 14.

In the semiconductor device, a chip mounting surface of the wiring substrate 503 and a circuit mounting surface of the semiconductor chip 501 face with and are stuck each other as shown in FIG. 13. Specifically, a first electrode 504 of the wiring substrate 503 and a second electrode 502 of the semiconductor chip 501 are directly joined.

(1) First of all, the first and second electrodes 504 and 502 are joined by the semiconductor manufacturing system 300 at the atmospheric pressure and in an inert gas such as $N_2$ or Ar (S450). Alternatively, the electrodes 504 and 502 may be joined in the air.

Prior to the joining process, at least either the first or second electrode 504 or 502 is shaped to be suitable to be joined. For instance, in the semiconductor chip 501 in the state of a wafer, the second electrode 502 is in the shape of a quadratic prism or a cylinder, and is mainly made of Ni. The second electrode 502 has a sectional area of 60 $\mu$m square or a circle of 60 $\mu$m diameter, and an arranging pitch of 100 $\mu$m. In the semiconductor chip 501, approximately hundred thousand second electrodes 502 are arranged per chip. In the wiring substrate 503, the first electrodes 504 are arranged at a pitch equal to that of the second electrode 502. The first electrode 504 is slightly larger than the second electrode 502 and has a square sectional area of 70 $\mu$m or a circular sectional areas of 70 $\mu$m. The first and second electrodes 504 and 502 are mainly made of Cu covered by Ni, and are not required to be in the shape of a bump, although the first and second electrodes 304 and 308 are bump electrodes in the fourth embodiment. This is because the first electrode 504 is slightly larger than the second electrode 502, i.e. they can be aligned with some margins kept around them when they are joined.

The stage 301 and the head 309 are spaced in the semiconductor manufacturing system 300. The robot 321 delivers the wiring substrate 503 to the stage 301 while the robot 322 delivers the semiconductor chip 501 to the head 309 (S451). The stage 301 and the head 309 are precisely maintained parallel to the x-y plane, without any inclination.

The CCD camera 305 takes picture of the first electrode 504 on the stage 301, and outputs position data of the first electrode 504 to the position adjusting mechanism 323. The CCD camera 306 takes picture of the second electrode 502 on the head 309, and outputs position data of the second electrode 502 to the position adjusting mechanism 323. On the basis of the received position data, the position adjusting mechanism 323 moves either the stage 301 or the head 309 on the x-y plane, adjusts the inclination θ, and aligns the first and second electrodes 504 and 502 (S452). Alternatively, alignment may be carried out by optical alignment using laser beams in place of the CCD cameras, as in the fourth embodiment.

The injection-movement controlling mechanism 331 lets the solvent injector 330 scan the wiring substrate 503. The solvent injector 330 injects the solvent onto the first electrode 504 in order to cover it (S453). In the fifth embodiment, the solvent is stuck onto only the first electrode 504. Alternatively, the solvent may be stuck onto only the second electrode 502, or both of the first and second electrodes 504 and 502. In this case, the solvent is in the non-activated state. When activated, the solvent melts or reduces oxide substances on a metal surface of the first electrode 504, similarly the solvent used in the fourth embodiment. Further, the solvent is heat-cured at a temperature high than the activation temperature, and is on the market under the name of "NO-FLOW UNDER-FILL RESIN".

Thereafter, the position adjusting mechanism 323 moves at least the stage 301 or the head 309 toward the axis z, thereby bringing the first and second electrodes 504 and 502 into contact with each other via the solvent (S454).

Further, the position adjusting mechanism 323 moves the stage 301 or the head 309 toward the axis z, compressing the first and second electrodes 504 and 502 (S455). In this state, the heater 302 in the stage 301 and the heater 310 in the head 309 heat the first and second electrodes 504 and 502, respectively. Resistance heating is performed in this case. Heating is performed to a temperature which is lower than the melting point of the first or second electrode 504 or 502 and until the solvent is activated. As described above, ultrasonic vibrations may be applied between the first and second electrodes 504 and 502 during the activation of the solvent. Application of ultrasonic vibrations promotes removal of oxide films from the surfaces of the first and second electrodes 504 and 502, and exposure of fresh surfaces of the first and second electrodes 504 and 502.

The first and second electrodes 504 and 502 are electrically and mechanically joined (S450).

(2) The wiring substrate 503 and the semiconductor chip 501 are carried to an annealing unit and are annealed at 250° C. for one hour (S460). The annealing process can obviate voids existing at the joined areas of the first and second electrodes 504 and 502, and join the electrodes 504 and 502 at increased areas and with an increased strength. This is effective in improving productivity of the semiconductor device. Further, when heat-cured, the solvent can form an under-fill resin 505. Therefore, the first and second electrodes 504 and 502 can be blocked from the air, and be reliably, electrically and mechanically joined with increased strength. Further, since neither cleaning nor refilling the under-fill resin is required, productivity of the semiconductor device can be improved further.

The annealing process may be carried out at 250° C. for 30 minutes if the solvent is simply heat-cured.

The method of the fifth embodiment is as advantageous as the method of the fourth embodiment. Further, the first electrode 504 and the second electrode 502 are joined via the solvent. Then, the solvent is heat-cured. Since no cleaning or refilling of the under-fill resin is necessary, it is possible to reduce the number of manufacturing processes.

[Modified Examples]

In the fifth embodiment, the solvent is stuck onto the first electrode (S454), the first and second electrodes are joined (S454), and the solvent is heated by the heaters 302 and 301 (S455). Alternatively, the solvent may be heated after it is stuck onto the first electrode, and the first and second electrodes may be joined via the activated solvent.

Further, the solvent may be activated by irradiating infrared rays, electron beams, laser beams or the like in place of the resistance heating.

Still further, a solvent which is in the shape of a film at a room temperature may be used. In such a case, the solvent can be easily stuck onto the semiconductor chip 501 kept by the head 309.

Other Embodiments of the Invention

The bump electrode 21 is the Cu bump electrode in the semiconductor device 2 of the first embodiment. Alternatively, the bump electrode 21 may be an Au or Ni bump electrode.

In the third embodiment, the semiconductor device 2 includes the Sn bump electrode. A two-component bump electrode such as an Sn—Pb, Sn—Ag, Sn—Zn or Sn—Cu bump electrode, a three-component bump electrode such as an Sn—Ag—Cu bump electrode, or four-component or more-component electrodes may be used to constitute the semiconductor device 2.

With the semiconductor device 2 of the first embodiment, the external connection electrode 18 (external connection terminal or external connection electrode) of the semiconductor chip 1 is provided with the UBM film 20 and the bump electrode 21. The external connection electrode 37 of the interposer 3 is provided with the UBM film 40 and the bump electrode 41. Alternatively, the electrode 52 (internal terminal or internal electrode) and the external connection terminal (not shown) of the multiple wiring substrate 5 may be provided with the UBM films and bump electrodes.

In the foregoing semiconductor device 2, only one semiconductor chip 1 is mounted on the multiple wiring substrate 5. Alternatively, a plurality of semiconductor chips 1 may be two-dimensionally mounted on the multiple wiring substrate 5.

Finally, the semiconductor devices and the manufacturing methods of the first to third embodiments and the semiconductor devices and the manufacturing methods of the fourth and fifth embodiments may be used in combination.

The embodiments of the present invention provides the semiconductor devices and the manufacturing methods which are advantageous in the following respects.

(1) The semiconductor devices can assure high integration, accelerated circuit operation and provision of a great number of terminals.

(2) The semiconductor devices can improve electrical and mechanical reliability of connections between electrodes and bump electrodes.

(3) The semiconductor device manufacturing methods can produce minute bump electrodes.

(4) The semiconductor device manufacturing methods can improve manufacturing throughput.

(5) The semiconductor device manufacturing methods can reduce the number of manufacturing processes.

(6) The solvent is present between the electrodes and removes metal oxide or the like from the electrodes when activated. The electrodes are compressed via the solvent. Neither a dangerous gas nor a vacuum unit is necessary in the joining process, so that a semiconductor manufacturing line can be simplified. Further, the electrodes can be joined without melting metal, which is effective in preventing poor joining between the electrodes.

Although the invention has been described with respect to some embodiments thereof, it will be understood that those skilled in the art that various modifications are possible without departing from the spirit of the present invention.

What is claimed is:

1. A semiconductor device comprising:
   a first electrode formed above a first substrate;
   an under bump metal film on said first electrode, said under bump metal film being in the shape of a recess;
   a bump electrode embedded in said under bump metal film, said bump electrode having sides and bottom thereof surrounded by said under bump metal film; and
   an insulating film configured to surround at least a part of side walls of said under bump metal film near said first electrode.

2. The semiconductor device of claim 1, wherein said bump electrode has a top surface whose height is substantially equal to height of side walls of said under bump metal film.

3. The semiconductor device of claim 1, wherein said bump electrode includes a chamfered upper peripheral edge.

4. The semiconductor device of claim 1, further comprising a second substrate including a second electrode connected to said bump electrode.

5. The semiconductor device of claim 4, wherein said second electrode is a plug, and said second substrate is an interposer.

6. A method of manufacturing a semiconductor device, comprising:
   forming an electrode above a substrate;
   forming an insulating film above said substrate, said insulating film having an aperture in communication with said electrode;
   forming an under bump metal film on said insulating film, an inner wall of said aperture and said electrode in said aperture;
   forming a bump electrode film on said under bump metal film, and embedding said bump electrode film in said aperture;
   removing said bump electrode film and said under bump metal film from portions except for said aperture to form a bump electrode; and
   taking off a part of a surface of said insulating film so as to project a part of said bump electrode from said insulating film.

7. The method of manufacturing a semiconductor device of claim 6, wherein:
   when forming said insulating film, a first insulating film is formed, and a second insulating film is formed on said first insulating film, said second insulating film having an etching ratio different from an etching ratio of said first insulating film; and when taking off at least a part of a surface at said insulating film, said second insulating film is selectively etched.

8. The method of manufacturing a semiconductor device of claim 6, wherein:
   when removing said bump electrode film and said under bump metal film, said under bump metal film and said bump electrode film on said insulating film and said aperture are removed by chemical mechanical polishing to form said bump electrode surrounded by said under bump metal film on said inner walls of said aperture and on said electrode in said aperture.

9. The method of manufacturing a semiconductor device of claim 6, wherein after taking off a part of the surface of said insulating film, said bump electrode is flattened at a top surface thereof.

10. The method of manufacturing a semiconductor device of claim 6, wherein after taking off the surface of said insulating film, said bump electrode is chamfered at a peripheral edge thereof.

11. The method of manufacturing a semiconductor device of claim 6, wherein said bump electrode is a solder bump electrode, and said solder bump electrode is subject to reflowing.

12. A method of manufacturing a semiconductor device, comprising:

forming a first substrate having a first electrode;

forming a second substrate having a second electrode;

applying a non-activated solvent onto a surface of at least one of said first and second electrodes;

bringing said second electrode into contact with said first electrode via said non-activated solvent, and compressing said first and second electrodes; and activating said solvent at a temperature which is lower than a melting point temperatures of said first and second electrodes, before said first and second electrodes are joined.

13. The method of manufacturing a semiconductor device of claim 12, wherein at least one of said first and second electrodes is a bump electrode.

14. The method of manufacturing a semiconductor device of claim 12, wherein at least one of said first and second electrodes contains at least one of Cu, Ni, Au and Ag.

15. The method of manufacturing a semiconductor device of claim 12, wherein said solvent contains inorganic or organic acid.

16. The method of manufacturing a semiconductor device of claim 12, wherein said solvent is activated by resistance heating, or by irradiating infrared rays, electron beams or laser beams.

17. A method of manufacturing a semiconductor device, comprising:

forming a first substrate having a first electrode;

forming a second substrate having a second electrode;

applying a non-activated solvent onto a surface of at least one of said first and second electrodes, said non-activated solvent being thermally set and being activated at a temperature which is lower than a thermo-setting temperature;

bringing said second electrode into contact with said first electrode via said non-activated solvent, and compressing said first and second electrodes;

activating said solvent at a temperature which is lower than a melting point temperatures of said first and second electrodes, before said first and second electrodes are joined; and heat-curing said solvent after said first and second electrodes are joined.

18. The method of manufacturing a semiconductor device of claim 17, wherein at least one of said first and second electrodes is a bump electrode.

19. The method of manufacturing a semiconductor device of claim 17, wherein at least one of said first and second electrodes contains at least one of Cu, Ni, Au and Ag.

20. The method of manufacturing a semiconductor device of claim 17, wherein said solvent contains inorganic and organic acid.

21. The method of manufacturing a semiconductor device of claim 17, wherein said solvent is activated by resistance heating, or by irradiating infrared rays, electron beams or laser beams.

22. The semiconductor device of claim 1, wherein said insulating film selectively surrounds a part of the side walls of said under bump metal film near said first electrode.

* * * * *